(12) United States Patent
Zhang

(10) Patent No.: US 12,438,090 B2
(45) Date of Patent: Oct. 7, 2025

(54) THREE-DIMENSIONAL MEMORY DEVICE AND METHODS FOR FORMING THE SAME

(71) Applicant: YANGTZE MEMORY TECHNOLOGIES CO., LTD., Wuhan (CN)

(72) Inventor: Mingkang Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 476 days.

(21) Appl. No.: 17/488,766

(22) Filed: Sep. 29, 2021

(65) Prior Publication Data

US 2023/0061992 A1    Mar. 2, 2023

Related U.S. Application Data

(63) Continuation of application No. PCT/CN2021/115757, filed on Aug. 31, 2021.

(51) Int. Cl.
*H01L 25/18* (2023.01)
*H01L 21/768* (2006.01)
(Continued)

(52) U.S. Cl.
CPC ...... *H01L 23/535* (2013.01); *H01L 21/76886* (2013.01); *H01L 21/76895* (2013.01);
(Continued)

(58) Field of Classification Search
CPC . H01L 23/535; H01L 23/53271; H01L 24/08; H01L 24/80
See application file for complete search history.

(56) References Cited

U.S. PATENT DOCUMENTS

| 9,530,790 B1 | 12/2016 | Lu et al. |
| 10,199,326 B1 | 2/2019 | Ohsaki |

(Continued)

FOREIGN PATENT DOCUMENTS

| CN | 107895724 A | 4/2018 |
| CN | 110249427 A | 9/2019 |

(Continued)

OTHER PUBLICATIONS

International Search Report issued in corresponding International Application No. PCT/CN2021/115757, mailed May 26, 2022, 4 pages.

(Continued)

*Primary Examiner* — Trang Q Tran
(74) *Attorney, Agent, or Firm* — BAYES PLLC

(57) ABSTRACT

In certain aspects, a three-dimensional (3D) memory device includes a first semiconductor structure and a second semiconductor structure bonded with the first semiconductor structure. The first semiconductor structure includes an array of NAND memory strings, a semiconductor layer in contact with source ends of the array of NAND memory strings, a non-conductive layer aligned with the semiconductor layer, and a contact structure in the non-conductive layer. The non-conductive layer electrically insulates the contact structure from the semiconductor layer. The second semiconductor structure includes a transistor.

20 Claims, 22 Drawing Sheets

(51) Int. Cl.
*H01L 23/00* (2006.01)
*H01L 23/532* (2006.01)
*H01L 23/535* (2006.01)
*H01L 25/00* (2006.01)
*H01L 25/065* (2023.01)

(52) U.S. Cl.
CPC ........ *H01L 23/53271* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(56) References Cited

U.S. PATENT DOCUMENTS

| | | | |
|---|---|---|---|
| 10,381,362 | B1 | 8/2019 | Cui et al. |
| 10,720,445 | B1 | 7/2020 | Shimizu et al. |
| 2016/0307910 | A1 | 10/2016 | Son et al. |
| 2018/0323200 | A1* | 11/2018 | Tang ..................... H01L 23/528 |
| 2019/0081068 | A1 | 3/2019 | Huang et al. |
| 2019/0088589 | A1 | 3/2019 | Zhu et al. |
| 2020/0279841 | A1 | 9/2020 | Sanuki |
| 2020/0312765 | A1 | 10/2020 | Kawasaki et al. |
| 2020/0350287 | A1 | 11/2020 | Liu |
| 2020/0388630 | A1 | 12/2020 | Yun et al. |
| 2020/0395376 | A1 | 12/2020 | Huo et al. |
| 2021/0074716 | A1 | 3/2021 | Lim et al. |
| 2021/0082865 | A1 | 3/2021 | Baraskar et al. |
| 2021/0118989 | A1 | 4/2021 | Liu et al. |
| 2022/0059481 | A1* | 2/2022 | Shibata ............... H01L 25/0657 |
| 2022/0068857 | A1* | 3/2022 | Chen .................... H01L 25/0657 |
| 2022/0115344 | A1* | 4/2022 | Kim ........................ H01L 24/80 |

FOREIGN PATENT DOCUMENTS

| | | |
|---|---|---|
| CN | 110291586 A | 9/2019 |
| CN | 110720143 A | 1/2020 |
| CN | 111566815 A | 8/2020 |
| CN | 112204734 A | 1/2021 |
| CN | 113169182 A | 7/2021 |
| CN | 113257739 A | 8/2021 |
| JP | S57157559 A | 9/1982 |
| JP | 2005175463 A | 6/2005 |
| JP | 2020513164 A | 4/2020 |
| JP | 202148249 A | 3/2021 |
| JP | 2021040125 A | 3/2021 |
| JP | 2021064731 A | 4/2021 |
| KR | 20200036503 A | 4/2020 |
| WO | 2019052127 A1 | 3/2019 |
| WO | 2020167355 A | 8/2020 |
| WO | 2021022403 A | 2/2021 |

OTHER PUBLICATIONS

International Search Report issued in corresponding International Application No. PCT/CN2021/115738, mailed May 26, 2022, 4 pages.

Supplementary European Search Report issued in corresponding European Application No. 21 95 5416, mailed on Jun. 24, 2024, 10 pages.

Notice of Reasons for Refusal issued in corresponding Japanese Application No. 2023-557427, dated Aug. 20, 2024, 12 pages.

\* cited by examiner

500

THREE-DIMENSIONAL MEMORY DEVICE AND METHODS FOR FORMING THE SAME

CROSS-REFERENCE TO RELATED APPLICATIONS

This application is a continuation of International Application No. PCT/CN2021/115757, filed on Aug. 31, 2021, entitled "THREE-DIMENSIONAL MEMORY DEVICE AND METHODS FOR FORMING THE SAME," which is hereby incorporated by reference in its entirety. This application is also related to U.S. Application Ser. No. 17/488,748, filed on Sep. 29, 2021, entitled "THREE-DIMENSIONAL MEMORY DEVICE AND METHODS FOR FORMING THE SAME," which is hereby incorporated by reference in its entirety.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

One aspect of the present disclosure provides a 3D memory device, includes a first semiconductor structure and a second semiconductor structure bonded with the first semiconductor structure. The first semiconductor structure includes an array of NAND memory strings, a semiconductor layer in contact with source ends of the array of NAND memory strings, a non-conductive layer aligned with the semiconductor layer, and a contact structure in the non-conductive layer. The non-conductive layer electrically insulates the contact structure from the semiconductor layer. The second semiconductor structure includes a transistor.

Another aspect of the present disclosure provides a 3D memory device that includes a first semiconductor structure having a core region and a non-array region. The first semiconductor structure includes an array of NAND memory strings in a sub-region of the core region, a semiconductor layer in contact with source ends of the array of NAND memory strings, a non-conductive layer in the non-array region, and a plurality of contact structures in the non-conductive layer and in another sub-region of the non-array region. The non-conductive layer electrically insulates the contact structures from the semiconductor layer. The 3D memory device includes a second semiconductor structure bonded with the first semiconductor structure. The second semiconductor structure includes a transistor.

Another aspect of the present disclosure provides a method for forming a 3D memory device. The method includes bonding a first semiconductor structure and a second semiconductor structure together, the first semiconductor structure having a core region and a non-array region. The method also includes depositing an undoped amorphous silicon layer over the core region and the non-array region of the first semiconductor structure, converting a first portion of the undoped amorphous silicon layer to a doped polysilicon layer, retaining a second portion of the undoped amorphous silicon layer in the non-array region, and forming a first contact portion in the second portion of the undoped amorphous silicon layer. The first contact portion is in contact with a second contact portion in the first semiconductor structure.

Another aspect of the present disclosure provides a system that includes a memory device configured to store data. The memory device includes a first semiconductor structure having an array of NAND memory strings, a semiconductor layer in contact with source ends of the array of NAND memory strings, a non-conductive layer in contact with the semiconductor layer, and a contact structure in the non-conductive layer. The non-conductive layer electrically insulates the contact structure from the semiconductor layer. The memory device also includes a second semiconductor structure bonded with the first semiconductor structure and having a transistor. The system also includes a memory controller coupled to the memory device and configured to control the array of NAND memory strings through a peripheral circuit.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
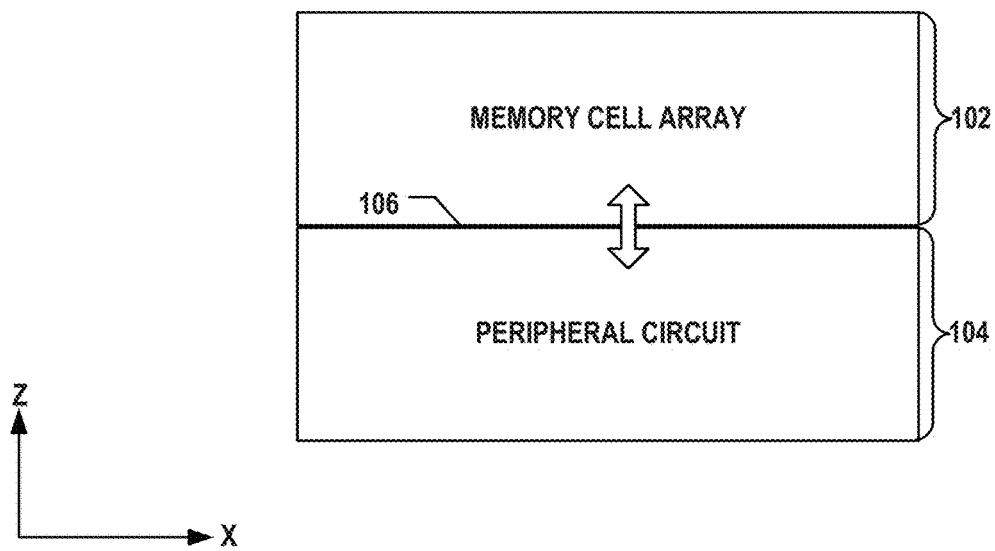
FIG. 1A illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

In 3D memory devices, peripheral circuits and memory cell arrays are disposed in different planes (levels, tiers) in the vertical direction, i.e., stacked over one another, to reduce the planar chip size of the peripheral circuits, as well as the total chip size of the memory device. In the 3D memory devices, the memory cells are formed by the intersections of NAND memory strings and word lines. The NAND memory strings are formed extending vertically in the memory stack (e.g., conductive/dielectric layer pairs), and source ends of the NAND memory strings are in contact with a semiconductor layer that functions as part of a source contact for applying a source voltage on the NAND memory strings. The memory stacks and the peripheral circuits are often integrated together through bonding in the 3D NAND Flash memory devices.

To form electrical connections in a 3D memory device (e.g., between the memory cell arrays and the peripheral circuits) and/or beyond the 3D memory device (e.g., between the 3D NAND Flash memory device and external circuitry), through-silicon contacts (TSCs) are often formed. To insulate the TSCs from the semiconductor layer, the portion of the semiconductor layer in contact with the NAND memory strings is often disconnected from the portion of the semiconductor layer through which the TSCs extend. An insulating portion is formed between the two portions of the semiconductor layer for insulation. Meanwhile, a respective insulating spacer is formed in the semiconductor layer such that the TSCs are each insulated from the semiconductor layer by the respective insulating spacer. The insulating spacers and the insulating portion are often formed by patterning the semiconductor layer to form openings and filling the openings with a dielectric material. Due to the small critical dimensions of these openings, the deposition of the dielectric material often includes atomic layer deposition (ALD). This fabrication process can be costly due to the high expense of photolithography, etching, and deposition. Meanwhile, the small critical dimensions of the openings can cause the etching process to form the openings to be undesirably complex, and the precise alignment between the openings and the TSCs to be challenging.

To address one or more of the aforementioned issues, the present disclosure provides structures and fabrication methods of a 3D memory device, in which the critical dimension of the opening to form a non-conductive layer that insulates the TSCs and the semiconductor layer is increased and the etching process to form the opening is omitted. The cost and the difficulty in insulating different portions of a semiconductor layer can be reduced. The 3D memory device, having a core region and a non-array region, includes a plurality of NAND memory strings in the core region and one or more TSCs in the non-array region. A semiconductor layer is in contact with the source ends of the NAND memory strings in the core region. According to the present disclosure, instead of forming a respective insulating spacer to insulate each TSC from the semiconductor layer, a single non-conductive layer can be formed to insulate a plurality of TSCs from the semiconductor layer. A lateral width of the non-conductive layer is sufficiently large to insulate any (e.g., all) TSCs from the semiconductor layer. The non-conductive layer can be formed at any suitable location where insulation is needed and is away from the source ends of the NAND memory strings. For example, the non-conductive layer can be formed in the non-array region. The non-conductive layer is in contact with the semiconductor layer laterally, and has the same thickness as the semiconductor layer. In some implementations, the non-conductive layer includes a non-conductive material such as undoped amorphous silicon.

Different from an existing patterning technique which includes a photolithography process and an etching process, the formation of the non-conductive layer of the present disclosure includes depositing a layer of the non-conductive material and retaining the non-conductive material in the non-array region. For example, an undoped amorphous silicon layer is first deposited in the non-array region and the core region. A portion of the undoped amorphous silicon layer in the core region, in contact with the source ends of the NAND memory strings, undergoes a doping process to be converted to a doped amorphous silicon portion. In some embodiments, the portion of the undoped amorphous silicon layer is converted to the doped amorphous silicon portion using an ion implantation process. The doped amorphous silicon portion is then converted to a doped polysilicon layer, e.g., a semiconductor layer, using a local thermal treatment such as a laser anneal process. The remaining portion of the undoped amorphous silicon layer, undoped and untreated, then functions as the non-conductive layer for insulating the TSCs from the semiconductor layer and the NAND memory strings. The area of the untreated portion of the undoped amorphous silicon layer can function as an non-conductive layer, covering any TSCs to be insulated and having no overlap with the source ends of the NAND memory strings. The non-conductive layer can further be patterned such that the TSCs can extend through the non-conductive layer.

In the fabrication process of the present disclosure, the formation of the non-conductive layer takes advantage of the material used to form the semiconductor layer. In some implementations, an undoped amorphous silicon layer, non-conductive, is deposited in both the core region and the non-array region. The undoped amorphous silicon can provide desirable insulation between the TSCs and the semiconductor layer. No additional insulating material needs to be deposited to form the non-conductive layer. Accordingly, no additional etching process is needed to remove any excess insulating material after the formation of the non-conductive layer. The critical dimension of the semiconductor layer is desirably large such that the laser beam can be precisely controlled for the annealing process. Compared to the existing patterning technique, the difficulty and cost of patterning can be reduced. The increased area of the non-conductive layer can also reduce the parasitic capacity of the 3D memory device.

Figure 1B:
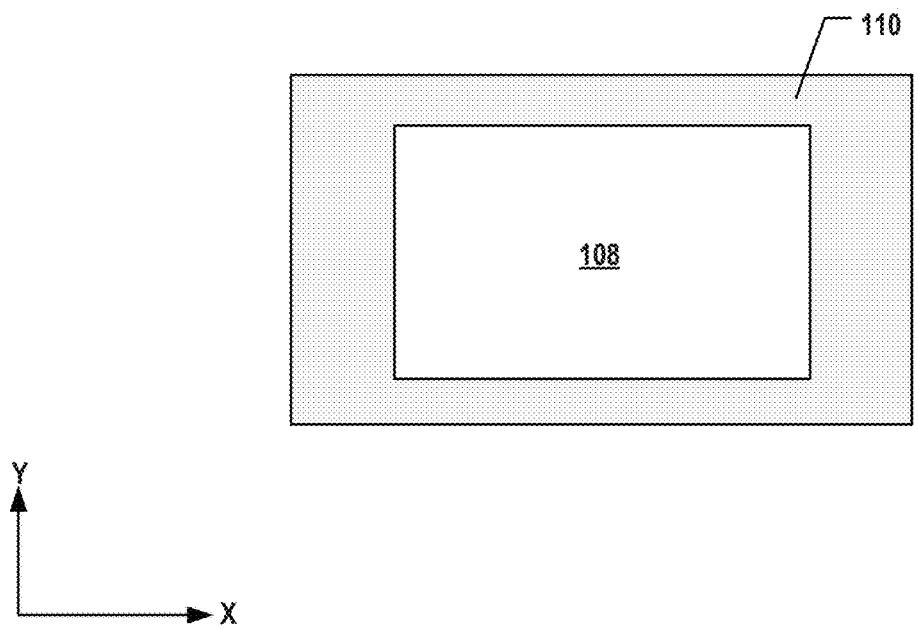
FIG. 1B illustrates an overview of the 3D memory device, according to some aspects of the present disclosure.

FIG. 1A illustrates a schematic view of a cross-section of a 3D memory device 100, according to some aspects of the present disclosure. FIG. 1B illustrates an overview of 3D memory device 100, according to some aspects of the present disclosure. 3D memory device 100 represents an example of a bonded chip. In some implementations, at least some of the components of 3D memory device 100 (e.g., memory cell array and peripheral circuits) are formed separately on different substrates in parallel and then jointed to form a bonded chip (a process referred to herein as a "parallel process").

It is noted that x-, y-, and z-axes are added in the figures of the present disclosure to further illustrate the spatial relationships of the components of a semiconductor device. A substrate of a semiconductor device, e.g., 3D memory device 100, includes two lateral surfaces (e.g., a top surface and a bottom surface) extending laterally in the x-direction and y-direction (the lateral directions or width directions). The x-direction is the word line direction of 3D memory device 100, the y-direction is the bit line direction of 3D memory device 100, and the z-direction is the perpendicular to the x-y plane. In some implementations, the z-direction is the NAND direction in which the NAND memory strings extend vertically. As used herein, whether one component (e.g., a layer or a device) is "on," "above," or "below" another component (e.g., a layer or a device) of a semiconductor device is determined relative to the substrate of the semiconductor device in the z-direction (the vertical direction or thickness direction) when the substrate is positioned in the lowest plane of the semiconductor device in the z-direction. The same notion for describing the spatial relationships is applied throughout the present disclosure.

3D memory device 100 can include a first semiconductor structure 102 including an array of memory cells (also referred to herein as a "memory cell array"). In some implementations, the memory cell array includes an array of NAND Flash memory cells. For ease of description, a NAND Flash memory cell array may be used as an example for describing the memory cell array in the present disclosure. But it is understood that the memory cell array is not limited to NAND Flash memory cell array and may include any other suitable types of memory cell arrays, such as NOR Flash memory cell array, phase change memory (PCM) cell array, resistive memory cell array, magnetic memory cell array, spin transfer torque (STT) memory cell array, to name a few.

First semiconductor structure 102 can be a NAND Flash memory device in which memory cells are provided in the form of an array of 3D NAND memory strings and/or an array of two-dimensional (2D) NAND memory cells. NAND memory cells can be organized into pages or fingers, which are then organized into blocks in which each NAND memory cell is coupled to a separate line called a bit line (BL). All cells with the same vertical position in the NAND memory cell can be coupled through the control gates by a word line (WL). In some implementations, a memory plane contains a certain number of blocks that are coupled through the same bit line. First semiconductor structure 102 can include one or more memory planes, and the peripheral circuits that are needed to perform all the read/program (write)/erase operations can be included in a second semiconductor structure 104.

In some implementations, the array of NAND memory cells is an array of 2D NAND memory cells, each of which includes a floating-gate transistor. The array of 2D NAND memory cells includes a plurality of 2D NAND memory strings, each of which includes a plurality of memory cells connected in series (resembling a NAND gate) and two select transistors, according to some implementations. Each 2D NAND memory string is arranged in the same plane (i.e., referring to herein a flat, two-dimensional (2D) surface, different from the term "memory plane" in the present discourse) on the substrate, according to some implementations. In some implementations, the array of NAND memory cells is an array of 3D NAND memory strings, each of which extends vertically above a semiconductor layer (in 3D) through a stack structure, e.g., a memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

Figure 3A:
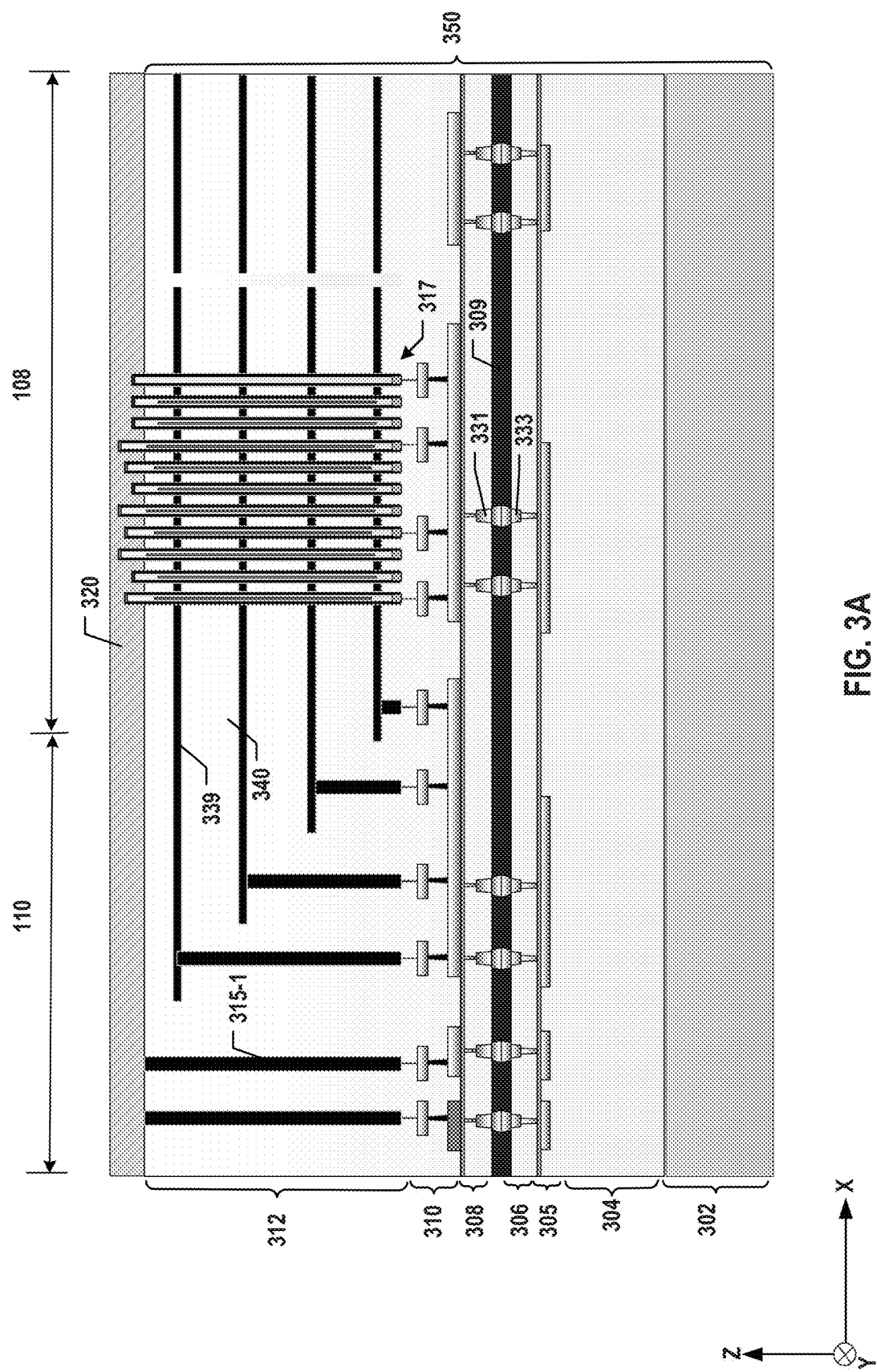
FIGS. 3A-3Q illustrate a fabrication process for forming the 3D memory devices in FIG. 2, according to some aspects of the present disclosure.
Figure 3B:
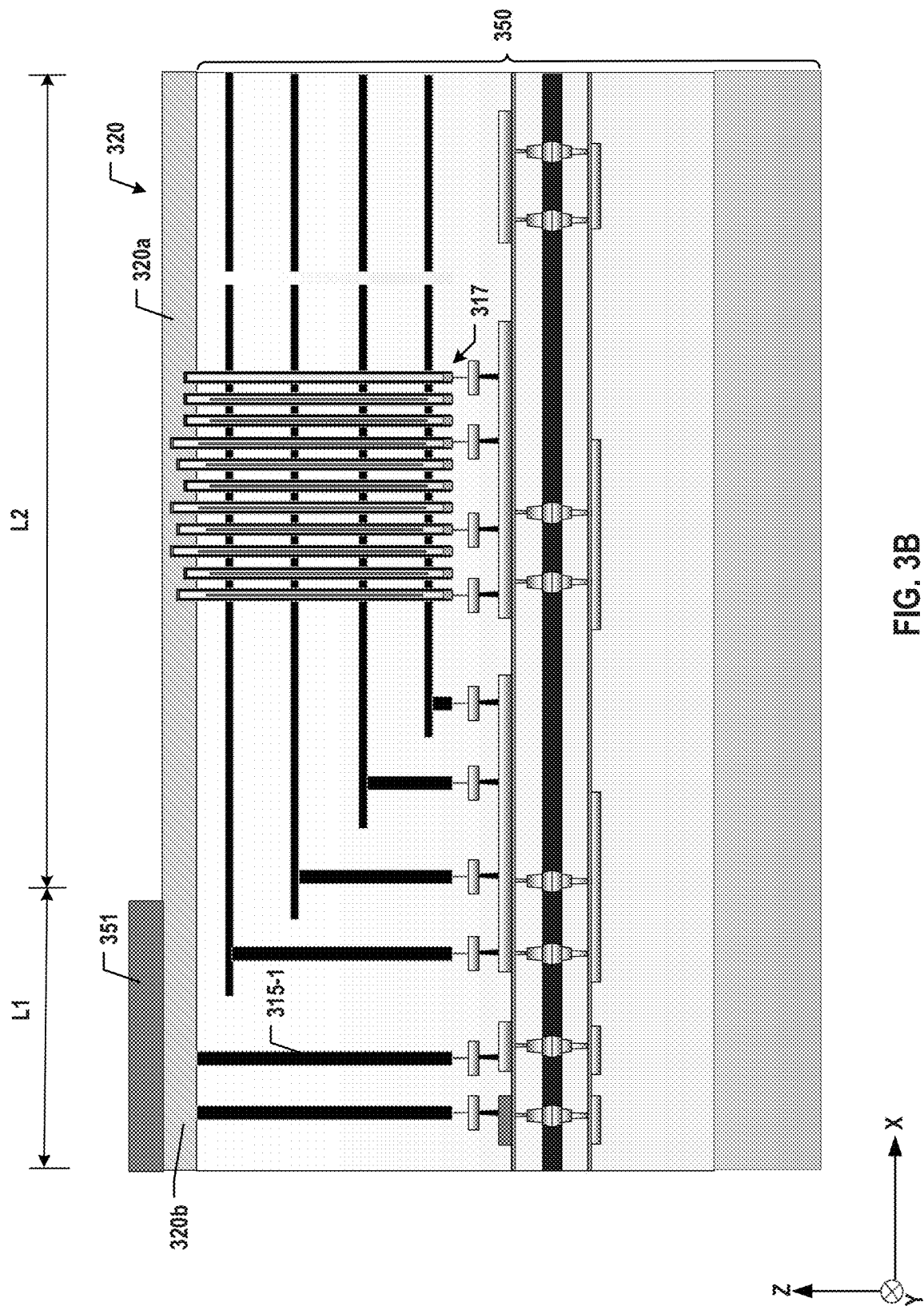
Figure 3C:
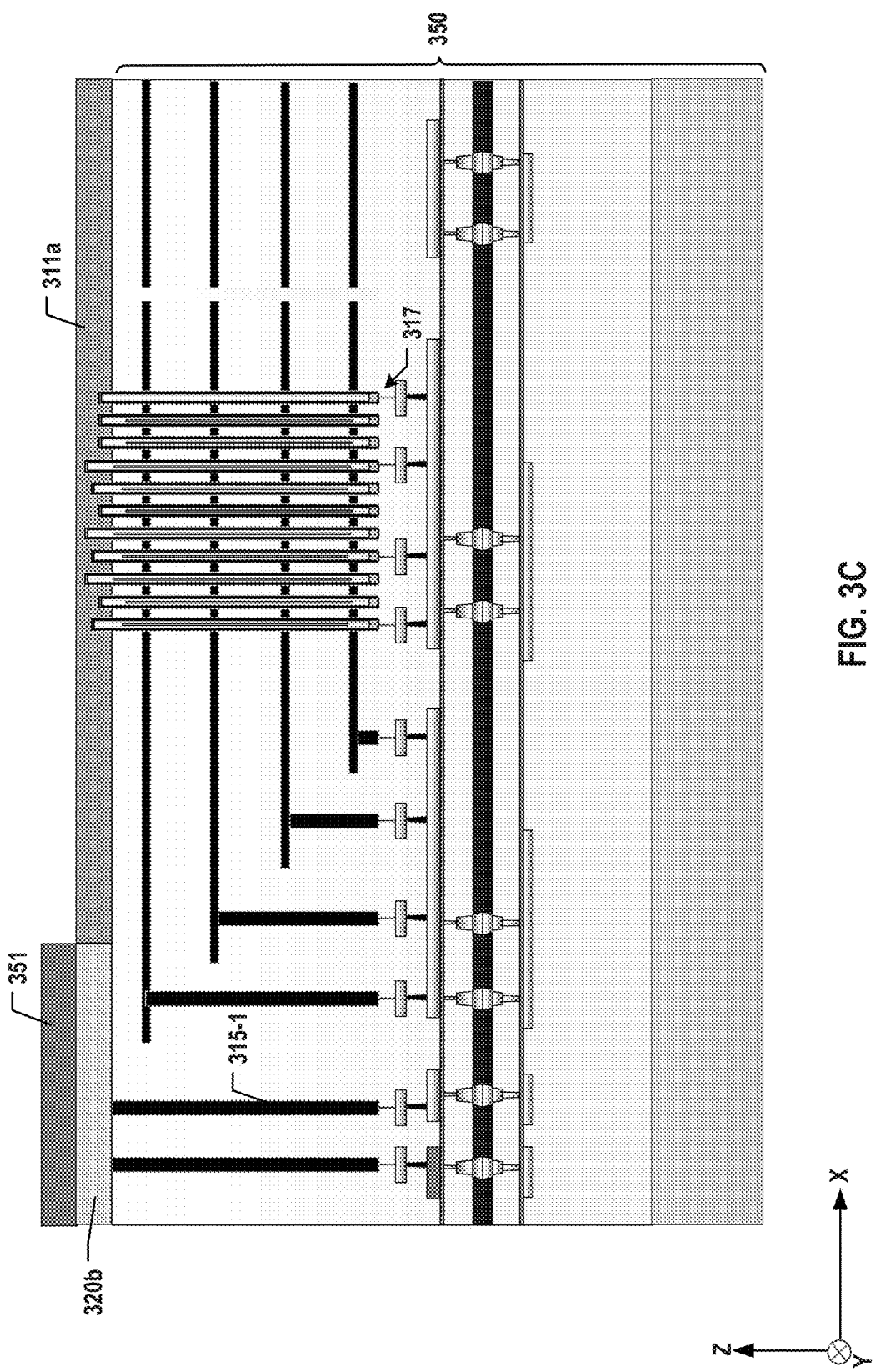
Figure 3D:
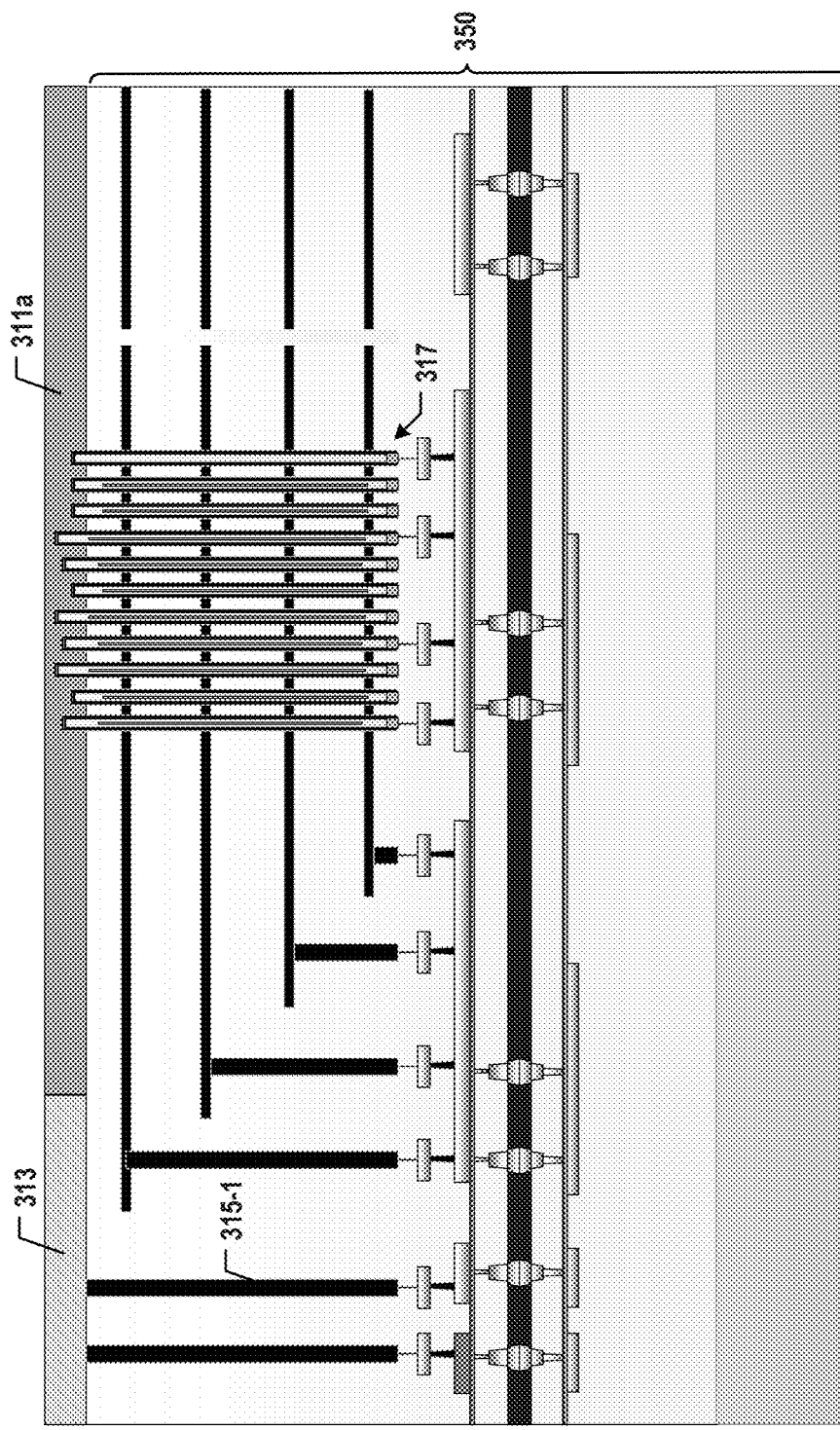

As shown in FIG. 1A, 3D memory device 100 can also include a second semiconductor structure 104 having the peripheral circuits of the memory cell array in first semiconductor structure 102. The peripheral circuits (a.k.a. control and sensing circuits) can include any suitable digital, analog, and/or mixed-signal circuits used for facilitating the operations of the memory cell array. For example, the peripheral circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in second semiconductor structure 104 can use complementary metal-oxide-semiconductor (CMOS) technology, e.g., which can be implemented with logic processes in any suitable technology nodes.

As shown in FIG. 1A, first and second semiconductor structures 102 and 104 are stacked over one another in different planes, according to some implementations. As a result, the memory cell array in first semiconductor structure 102 and the peripheral circuits in second semiconductor structure 104 can be stacked over one another in different planes to reduce the planar size of 3D memory device 100, compared with memory devices in which all the peripheral circuits are disposed in the same plane. As shown in FIG. 1A, in some implementations, first semiconductor structure 102 is above second semiconductor structure 104 and includes a pad-out interconnect layer for pad-out purposes. TSVs may be formed extending in first semiconductor structure 102, providing electrical connection between components in memory device 100 (e.g., the peripheral circuits and/or the memory cell array) and any external circuitry.

As shown in FIG. 1A, 3D memory device 100 further includes a bonding interface 106 vertically between first semiconductor structure 102 and second semiconductor structure 104. Bonding interface 106 can be an interface between two semiconductor structures formed by any suitable bonding technologies as described below in detail, such as hybrid bonding, anodic bonding, fusion bonding, transfer bonding, adhesive bonding, eutectic bonding, to name a few. Data transfer between the memory cell array in first semiconductor structure 102 and the peripheral circuit in second semiconductor structure 104 can be performed through the interconnects (e.g., bonding contacts) across bonding interface 106. As shown in FIG. 1A, in some implementations, in the z-direction, the memory cell array is above bonding interface 106, and the peripheral circuit is below bonding interface 106.

As described below in detail, some of first and second semiconductor structures 102 and 104 can be fabricated separately (and in parallel in some implementations) by the parallel process, such that the thermal budget of fabricating one of first and second semiconductor structures 102 and 104 does not limit the processes of fabricating another one of first and second semiconductor structures 102 and 104. Moreover, a large number of interconnects (e.g., bonding contacts and/or inter-layer vias (ILVs)/through substrate vias (TSVs)) can be formed across bonding interface 106 to make direct, short-distance (e.g., micron- or submicron-level) electrical connections between adjacent semiconductor structures 102 and 104.

FIG. 1B illustrates an overview of memory device 100, according to some aspects of the present disclosure. Specifically, FIG. 1B shows a core region 108 and a non-array region 110 in first semiconductor structure 102, in the x-y plane. In some implementations, the memory cell array is formed in core region 108, and the TSCs are formed in non-array region 110. In some implementations, non-array region 110 is located in the outer periphery of core region 108 or surrounds core region 108. Non-array region 110 may represent any region in which TSCs are formed. For example, non-array region 110 may be a region away from the memory cell arrays, e.g., a staircase region. In various implementations, other regions may be included in non-array region 110 but is not part of the staircase region. In some implementations, in the x-y plane, non-array region 110 and core region 108 do not overlap with each other.

Figure 1C:
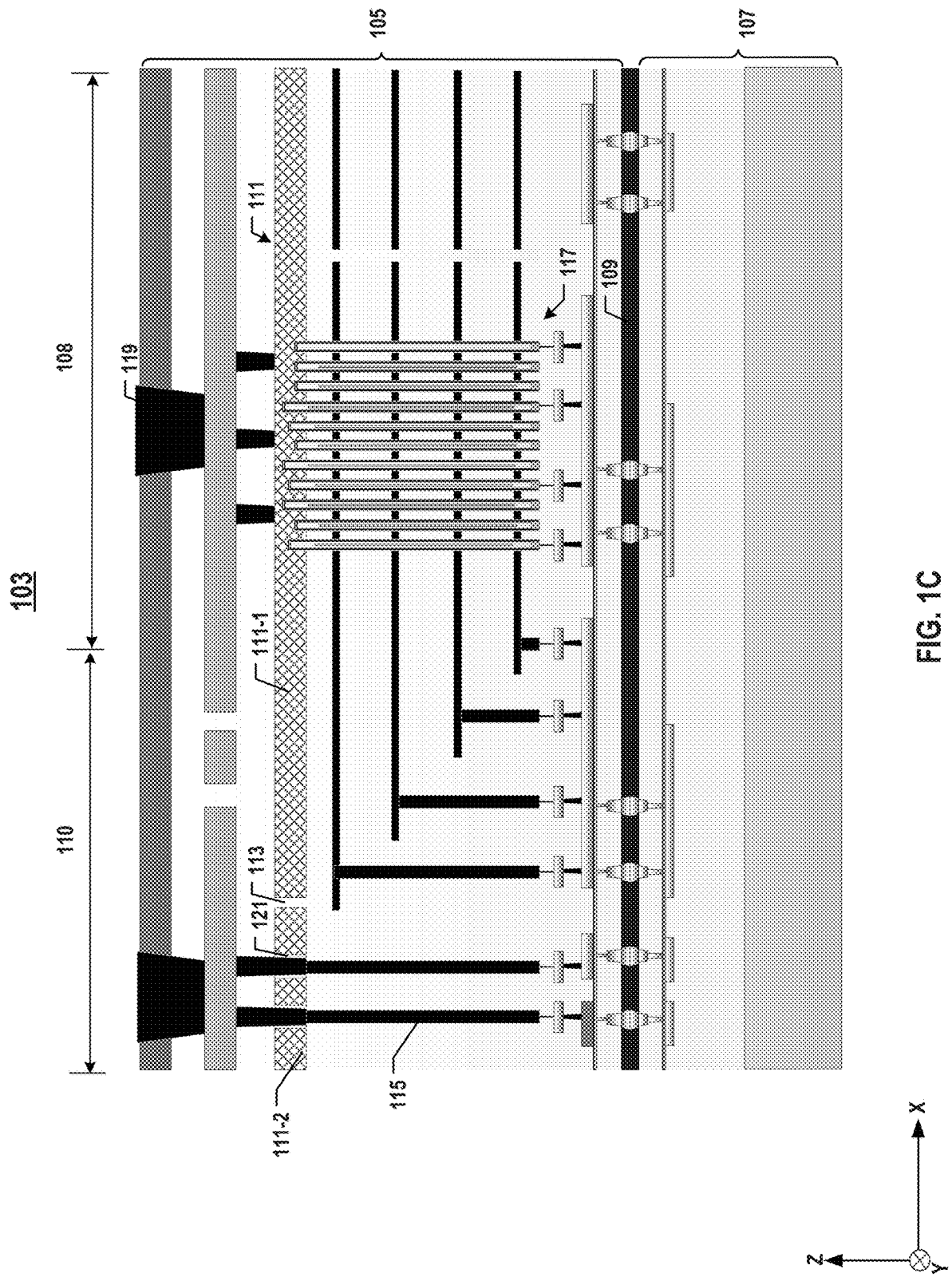
FIG. 1C illustrates a side view of an example of a 3D memory device in FIGS. 1A and 1B.

FIG. 1C illustrates a side view of part of a 3D memory device 103, which is an example of memory device 100. 3D memory device includes a first semiconductor structure 105 and a second semiconductor structure 107, bonded with each other at a boding interface 109. First semiconductor structure 105 is an example of first semiconductor structure 102, and second semiconductor structure 107 is an example of second semiconductor structure 104. First semiconductor structure 105 includes a plurality of NAND memory strings 117, a plurality of TSCs 115, a semiconductor layer 111, and a plurality of pad-out interconnects 119. Source ends of NAND memory strings 117, located in core region 108, are in contact with a first portion of semiconductor layer 111-1. A second portion of semiconductor layer 111-2 is insulated/disconnected from first portion of semiconductor layer 111-1 by an insulating portion 113, which includes a dielectric material such as silicon oxide. TSCs 115, located in non-array region 110 and extending through second portion of semiconductor layer 111-2. Pad-out interconnects 119 may be conductively connected to components in 3D memory device 103 for pad-out purposes. Each TSC 115 is in (e.g., through) a respective insulating spacer 121 in second portion of semiconductor layer 111-2. Insulating spacers 121 include the same material, e.g., silicon oxide, as insulating portion 113.

Insulating portion 113 and insulating spacers 121 are formed by patterning semiconductor layer 111 to form respective openings, and filling the openings with a dielectric material. The patterning process often includes a photolithography process followed by an etching process. The openings for forming insulating spacers 121 are be precisely aligned with TSCs 115. Due to the small critical dimensions of insulating portion 113 and insulating spacers 121, the dielectric material is often deposited using ALD. The fabrication process to form 3D memory device 103 can thus be challenging and costly.

Figure 2:
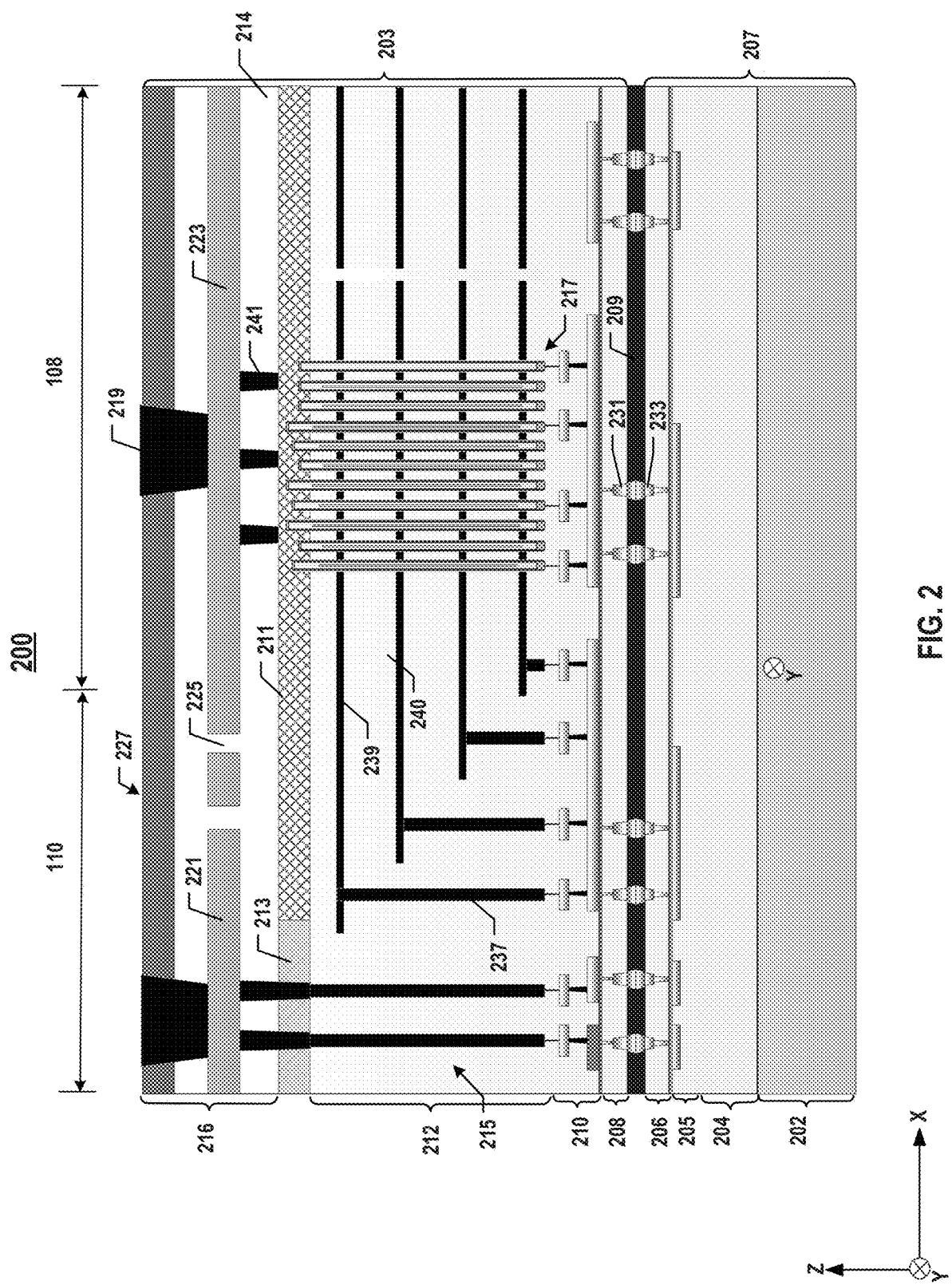
FIG. 2 illustrates a side view of an example of a 3D memory device in FIGS. 1A and 1B, according to some aspects of the present disclosure.

FIG. 2 illustrates a side view of part of an exemplary 3D memory device 200 in the x-z plane, according to some aspects of the present disclosure. 3D memory device 200 can be an example of memory device 100 and is a bonded chip including first semiconductor structure 203 and second semiconductor structure 207, stacked in different planes in the vertical direction (e.g., the z-direction), according to some implementations. First and second semiconductor structures 203 and 207 are bonded at bonding interface 209 therebetween, according to some implementations. It should be noted that, the components shown in FIGS. 2, 3A-3N, 4A and 4B are meant for showing the relative positions and do not indicate the actual electrical connections in 3D memory device 200.

As shown in FIG. 2, first and second semiconductor structures 203 and 207 may be bonded to each other in a face-to-face manner at bonding interface 209. Second semiconductor structure 207 can include a substrate 202 and a device layer 204 above and in contact with substrate 202. Substrate 202 can include silicon (e.g., single crystalline silicon, c-silicon), silicon germanium (SiGe), gallium arsenide (GaAs), germanium (Ge), silicon on insulator (SOI), germanium on insulator (GOI), or any other suitable semiconductor materials. In some implementations, element 202 represents a semiconductor layer, which can be formed by thinning a substrate. In some implementations, substrate 202 includes single crystalline silicon. In some implementations, device layer 204 includes a peripheral circuit (details not shown in the figures). The peripheral circuit can include high voltage (HV) circuits, such as driving circuits, and low voltage (LV) circuits, such as page buffer circuits and logic circuits. In some implementations, the peripheral circuit includes a plurality of transistors in contact with substrate 202 (or semiconductor layer 202, if applicable). The transistors can include any transistors disclosed herein, such as planar transistors and 3D transistors.

In some implementations, second semiconductor structure 207 further includes an interconnect layer 205 above device layer 204 to transfer electrical signals to and from the peripheral circuit in device layer 204. As shown in FIG. 2, interconnect layer 205 can be vertically between bonding interface 209 and device layer 204 (including the transistors of the peripheral circuit). Interconnect layer 205 can include a plurality of interconnects, including lateral lines and vias. As used herein, the term "interconnects" can broadly include any suitable types of interconnects, such as middle-end-of-line (MEOL) interconnects and back-end-of-line (BEOL) interconnects. Interconnects can be coupled to the transistors of the peripheral circuit in device layer 204. Interconnect layer 205 can further include one or more interlayer dielectric (ILD) layers (also known as "intermetal dielectric (IMD) layers") in which the lateral lines and vias can form. That is, interconnect layer 205 can include lateral lines and vias in multiple ILD layers. In some implementations, the devices in device layer 204 are coupled to one another through the interconnects in interconnect layer 205. The interconnects in interconnect layer 205 can include conductive materials including, but not limited to, W, Co, Cu, Al, silicides, or any combination thereof. The ILD layers in interconnect layer 205 can include dielectric materials including, but not limited to, silicon oxide, silicon nitride, silicon oxynitride, low dielectric constant (low-k) dielectrics, or any combination thereof. In some implementations, the interconnects in interconnect layer 205 include W, which has a relatively high thermal budget (compatible with high-temperature processes) and good quality (fewer defects, e.g., voids) among conductive metal materials.

As shown in FIG. 2, second semiconductor structure 207 can further include a bonding layer 206 at bonding interface 209 and above and in contact with interconnect layer 205. Bonding layer 206 can include a plurality of bonding contacts 233 and dielectrics electrically isolating bonding contacts 233. Bonding contacts 233 can include conductive materials including, but not limited to, W, Co, Cu, Al, silicides, or any combination thereof. In some implementations, bonding contacts 233 of bonding layer 206 include Cu. The remaining area of bonding layer 206 can be formed with dielectrics including, but not limited to, silicon oxide, silicon nitride, silicon oxynitride, low-k dielectrics, or any combination thereof. Bonding contacts 233 and surrounding dielectrics in bonding layer 206 can be used for hybrid bonding (also known as "metal/dielectric hybrid bonding"), which is a direct bonding technology (e.g., forming bonding between surfaces without using intermediate layers, such as solder or adhesives) and can obtain metal-metal (e.g., Cu-to-Cu) bonding and dielectric-dielectric (e.g., $SiO_2$-to-$SiO_2$) bonding simultaneously.

As shown in FIG. 2, first semiconductor structure 102 can further include a bonding layer 208 at bonding interface 209, e.g., on the opposite side of bonding interface 209 with respect to bonding layer 206 in second semiconductor structure 207. Bonding layer 208 can include a plurality of bonding contacts 231 and dielectrics electrically isolating bonding contacts 231. Bonding contacts 231 can include conductive materials, such as Cu. The remaining area of bonding layer 208 can be formed with dielectric materials, such as silicon oxide. Bonding contacts 231 and surrounding dielectrics in bonding layer 208 can be used for hybrid bonding. In some implementations, bonding interface 209 is the place at which bonding layers 208 and 206 are met and bonded. In practice, bonding interface 209 can be a layer with a certain thickness that includes the top surface of bonding layer 206 and the bottom surface of bonding layer 208. For example, bonding interface may be distinguished based on the relative positions, e.g., shifts, of bonded contacts 231 and 233.

As shown in FIG. 2, first semiconductor structure 203 can further include an interconnect layer 210 above and in contact with bonding layer 208 to transfer electrical signals. Interconnect layer 210 can include a plurality of interconnects, such as MEOL interconnects and BEOL interconnects. In some implementations, the interconnects in interconnect layer 210 also include local interconnects, such as bit line contacts and word line contacts. Interconnect layer 210 can further include one or more ILD layers in which the lateral lines and vias can form. The interconnects in interconnect layer 210 can include conductive materials including, but not limited to, W, Co, Cu, Al, silicides, or any combination thereof. The ILD layers in interconnect layer 210 can include dielectric materials including, but not limited to, silicon oxide, silicon nitride, silicon oxynitride, low-k dielectrics, or any combination thereof.

As shown in FIG. 2, first semiconductor structure 203 can include a memory cell array, such as an array of NAND memory strings 217 above and in contact with interconnect layer 210. In some implementations, interconnect layer 210 is vertically between NAND memory strings 217 and bonding interface 209. Each NAND memory string 217 extends vertically through a plurality of pairs of gate conductive layer 239 and dielectric layer 240, according to some implementations. The stacked and interleaved gate conductive layers 239 and dielectric layers 240 are also referred to herein as a stack structure, e.g., a memory stack 212. The interleaved gate conductive layers 239 and dielectric layers 240 in memory stack 212 alternate in the vertical direction, according to some implementations. Each gate conductive layer 239 can include a gate electrode (gate line) surrounded by an adhesive layer and a gate dielectric layer. The adhesive layer can include conductive materials, such as titanium nitride (TiN), which can improve the adhesiveness between the gate electrode and the gate dielectric layer. The gate electrode of gate conductive layer 239 can extend laterally as a word line, ending at one or more staircase structures of memory stack 212. The staircase structures, located in staircase region, which is part of non-array region 110, may be in contact with a plurality of word line contacts 237 for applying voltages on gate conductive layers 239.

The number of the pairs of gate conductive layers 239 and dielectric layers 240 in memory stack 212 can be one of the factors that determine the number of memory cells in the memory cell array. Gate conductive layer 239 can include conductive materials including, but not limited to, tungsten (W), cobalt (Co), copper (Cu), aluminum (Al), polysilicon, doped silicon, silicides, or any combination thereof. In some implementations, each gate conductive layer 239 includes a metal layer, such as a tungsten layer. In some implementations, each gate conductive layer 239 includes a doped polysilicon layer. Each gate conductive layer 239 can include control gates surrounding the memory cells.

As shown in FIG. 2, each NAND memory string 217 includes a channel structure extending vertically through memory stack 212. In some implementations, the channel structure includes a channel hole filled with semiconductor material(s) (e.g., as a semiconductor channel) and dielectric material(s) (e.g., as a memory film). In some implementations, the semiconductor channel includes silicon, such as polysilicon. In some implementations, the memory film is a composite dielectric layer including a tunneling layer, a storage layer (also known as a "charge trap/storage layer"), and a blocking layer. The channel structure can have a cylinder shape (e.g., a pillar shape). The semiconductor channel, the tunneling layer, the storage layer, the blocking layer are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the memory film may include a composite layer of silicon oxide/silicon oxynitride/silicon oxide (ONO). The channel structure can further include a channel plug on the drain end of NAND memory string 217. The channel plug can include polysilicon and be in contact with the semiconductor channel. In some implementations, each NAND memory string 217 is a "charge trap" type of NAND memory. It is understood that NAND memory strings 217 are not limited to the "charge trap" type of NAND memory strings and may be "floating gate" type of NAND memory strings in other examples.

NAND memory string 217 is free of any semiconductor plug on the source end thereof, according to some implementations. Instead, 3D memory device 200 includes a semiconductor layer 211 above and in contact with memory stack 212. Semiconductor layer 211 can be in contact with the sidewall of the semiconductor channel of the channel structure at the source end of each NAND memory strings 217. Semiconductor layer 211 can include semiconductor materials, such as doped polysilicon. In some implementations, semiconductor layer 211 is doped with N-type dopants such as phosphorus and/or arsenic. The thickness of semiconductor layer 211 may be in a range of 100 nm to 600 nm. In some implementations, semiconductor layer 211 and a source contact in a slit structure (e.g., array common source or ACS, not shown) may collectively function as parts of a source line (not shown) coupled to the source ends of NAND memory string 217, for example, for applying an erase voltage to the source ends of NAND memory string 217 during erase operations.

A non-conductive layer 213 may laterally be aligned with (e.g., at the same elevation in the z-direction as) semiconductor layer, and may have the same thickness as semiconductor layer 211. In some implementations, non-conductive layer 213 is in contact with semiconductor layer 211. Semiconductor layer 211, partially or totally located in core region 108, may be above and in contact with the source ends of NAND memory strings 217. An area of semiconductor layer 211 may be sufficiently large, e.g., larger than or equal to the total area (e.g., a sub-region of core region 108) in which all NAND memory strings 217 are formed, to be in contact with the source ends of all NAND memory strings 217. An area of non-conductive layer 213 may be sufficiently large, e.g., larger than or equal to the total area (e.g., a sub-region of non-array region 110) of part or all contact structures 215. In some implementations, non-conductive layer 213 extends, laterally, from a boundary of semiconductor layer 211 to the outer periphery of non-array region 110. In some implementations, a top surface of non-conductive layer 213 is coplanar with a top surface of semiconductor layer 211, and a bottom surface of non-conductive layer 213 is coplanar with a bottom surface of semiconductor layer 211. Non-conductive layer 213 may include a non-conductive material such as undoped amorphous silicon. In some implementations, non-conductive layer 213 is a single insulating layer that includes consistent medium/material in the x-y plane. That is, non-conductive layer 213 may not be disconnected between any two contact structures 215.

As shown in FIG. 2, first semiconductor structure 203 can further include one or more contact structures 215 extending vertically through non-conductive layer 213. In some implementations, contact structures 215 couples the interconnects in interconnect layer 210 to pad-out interconnects 219 in pad-out interconnect layer 216 to facilitate electrical connection through first semiconductor structure 203. Contact structures 215 can include conductive materials including, but not limited to, W, Co, Cu, Al, silicides, or any combination thereof. In some implementations, contact structures 215 include W. In some implementations, contact structures 215 each may be a TSV having a depth, e.g., length along the z-direction, in the micron- or tens micron-level (e.g., between 1 μm and 100 μm).

As shown in FIG. 2, contact structures 215 may be located in non-array region 110 of first semiconductor structure 203 or may be located away from NAND memory strings 217. In some implementations, non-conductive layer 213 may be partially or fully located in non-array region 110 to provide insulation of at least one contact structure 215 from semiconductor layer 211. In some implementations, non-conductive layer 213 is located in the staircase region of 3D memory device 200. In some other implementations, non-conductive layer 213 is located outside the staircase region but in non-array region 110. In some implementations, a width of non-conductive layer 213 in the x-direction and/or y-direction is sufficiently large to enclose a plurality of, e.g., all, contact structures 215 in non-array region 110 such that all contact structures 215 surrounded/in non-conductive layer 213 are insulated from semiconductor layer 211. In various implementations, non-conductive layer 213 may be away from, in the x-y plane, the source ends of NAND memory strings 217, and the width and/or area of non-conductive layer 213 can be desirably large to insulate a maximum number of contact structures 215. For example, the area of non-conductive layer 213 may be greater than or equal to the total area in which contact structures 215 are located. The orthographic projection of non-conductive layer 213 in the x-y plane may cover a plurality, e.g., all, contact structure 215. In some implementations, non-conductive layer 213 is located in non-array region 110. In various implementations, the orthographic projection of non-conductive layer 213 is at least partially overlapped with the staircase region. In some implementations, the orthographic projection of non-conductive layer 213 has no overlap with core region 108. In some implementations, the orthographic projection of insulating layer 213 is partially overlapped with core region 108. In some implementations, a ratio of depth over width of non-conductive layer 213 is less than or equal to ⅓. For example, the ratio is less than or equal to ⅕.

As shown in FIG. 2, first semiconductor structure 203 can further include a pad-out interconnect layer 216 above and in contact with semiconductor layer 211. In some implementations, semiconductor layer 211 is disposed vertically, e.g., in the z-direction, between pad-out interconnect layer 216 and NAND memory strings 217. Pad-out interconnect layer 216 can include a first insulating layer 214 above and in contact with semiconductor layer 211 and non-conductive layer 213, a plurality of contacts 241 above and in contact with semiconductor layer 211, a first contact layer 221 above and in contact with contact structures 215, a second contact layer 223 above and in contact with contacts 241, a second insulating layer 227 above and in contact with first and second contact layers 221 and 223, and a plurality of pad-out interconnects 219, e.g., contact pads, in second insulating layer 227. In some implementations, pad-out interconnects 219 conductively connected to contact structures 215 are employed to drive the transistors in the peripheral circuit in device layer 204. In some implementations, pad-out interconnects 219 conductively connected to NAND memory strings 217 are employed to provide voltages for operations of the memory cells such as erase, write, and read.

First insulating layer 214 may provide insulation amongst contact structures 215 and contacts 241. First contact layer 221, in contact with contact structures 215 and respective pad-out interconnects 219, may provide electrical connection between contact structures 215 and the respective pad-out interconnects 219. Second contact layer 223, in contact with contacts 241 and respective pad-out interconnects 219, may provide electrical connection between the source ends of NAND memory strings 217, and the respective pad-out interconnects 219. First and second contact layers 221 and 223 may be insulated from each other, e.g., by one or more insulating portions 225. In some implementations, pad-out interconnects 219 can transfer electrical signals between 3D memory device 200 and external devices, e.g., for pad-out purposes. In some implementations, first insulating layer 214, insulating portions 225, and second insulating layer 227 may each include a dielectric material such as silicon oxide, silicon nitride, silicon oxynitride, a low-k dielectric material, or any combination thereof. Each of first insulating layer 214 and second insulating layer 227 may be a single-layered structure or a multi-layered structure. For example, second insulating layer 227 may include a silicon nitride layer over a silicon oxide layer. The silicon oxide layer may be in contact with first and second contact layers 221 and 223, and the silicon nitride layer may cover the silicon oxide layer. The silicon oxide layer may provide balanced stress on the first and second contact layers and the silicon nitride layer. The silicon nitride layer may provide desired insulation against contamination such as moist, air, and/or chemicals. Contact structures 215, contacts 241, first and second contact layers 221 and 223, and pad-out interconnects 219 may each include tungsten (W), cobalt (Co), copper (Cu), aluminum (Al), polysilicon, doped silicon, silicides, or any combination thereof. In some implementations, contact structures 215, contacts 241, and pad-out interconnects 219 may each include tungsten.

Figure 3E:
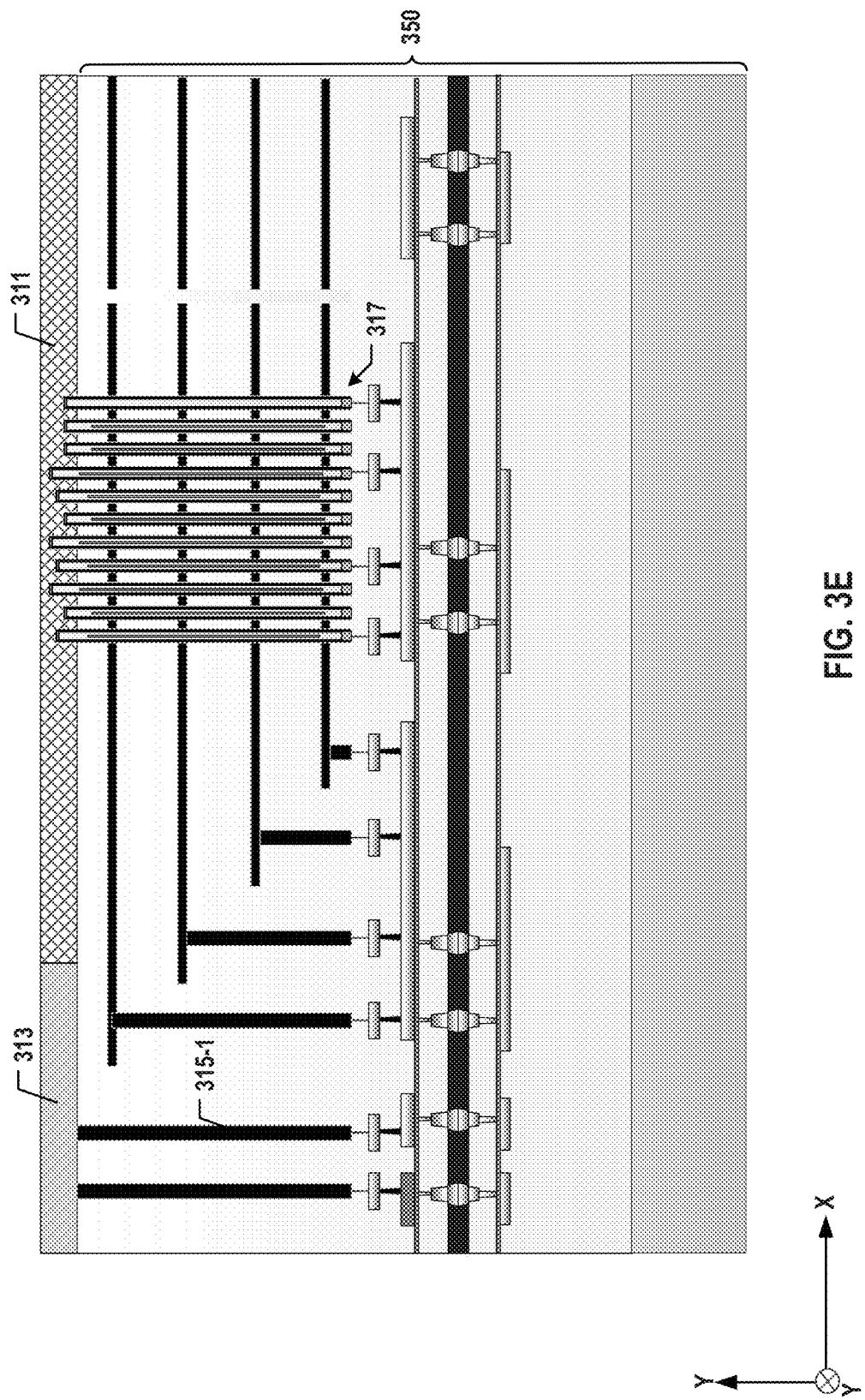
Figure 3F:
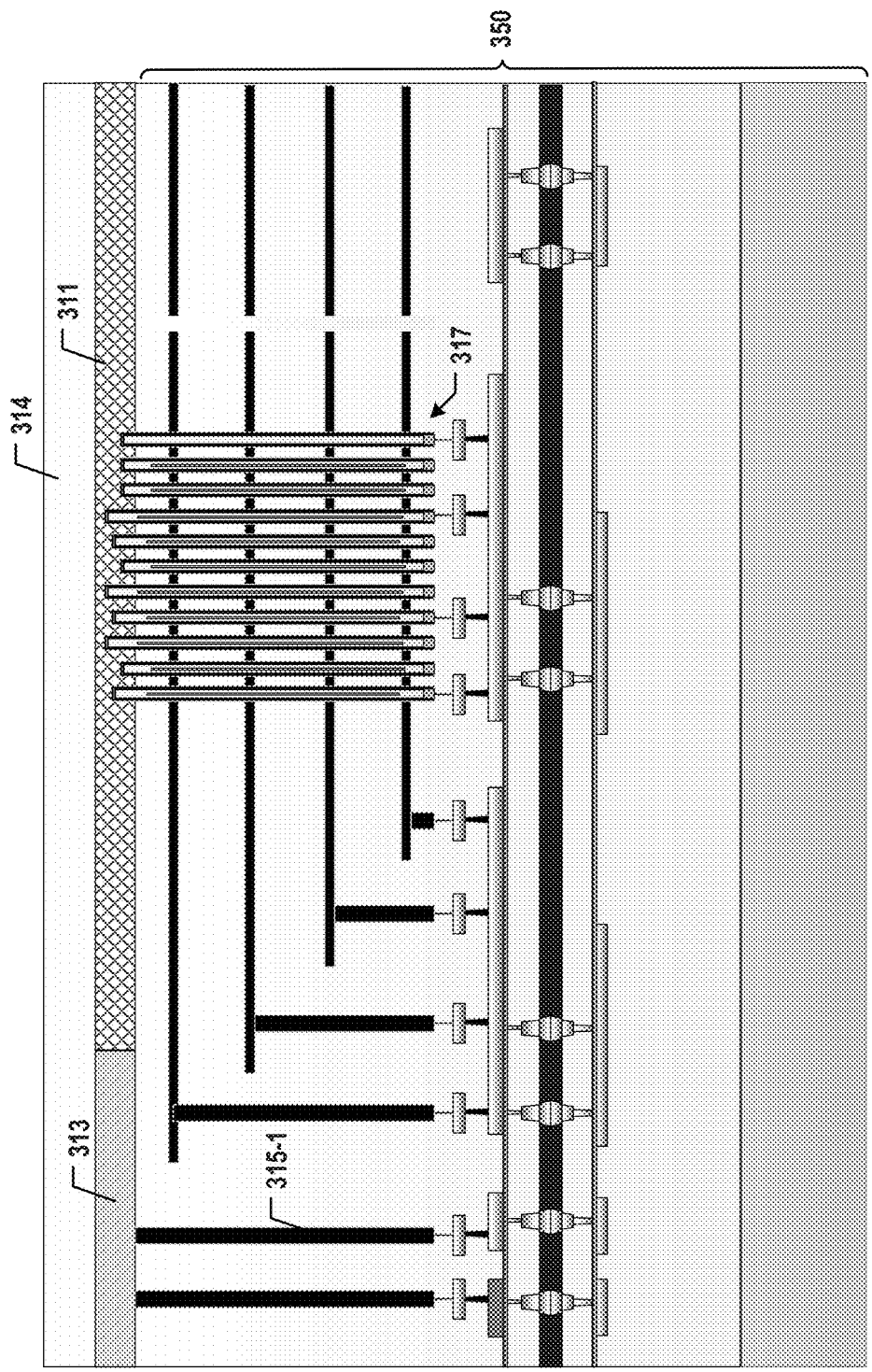
Figure 3G:
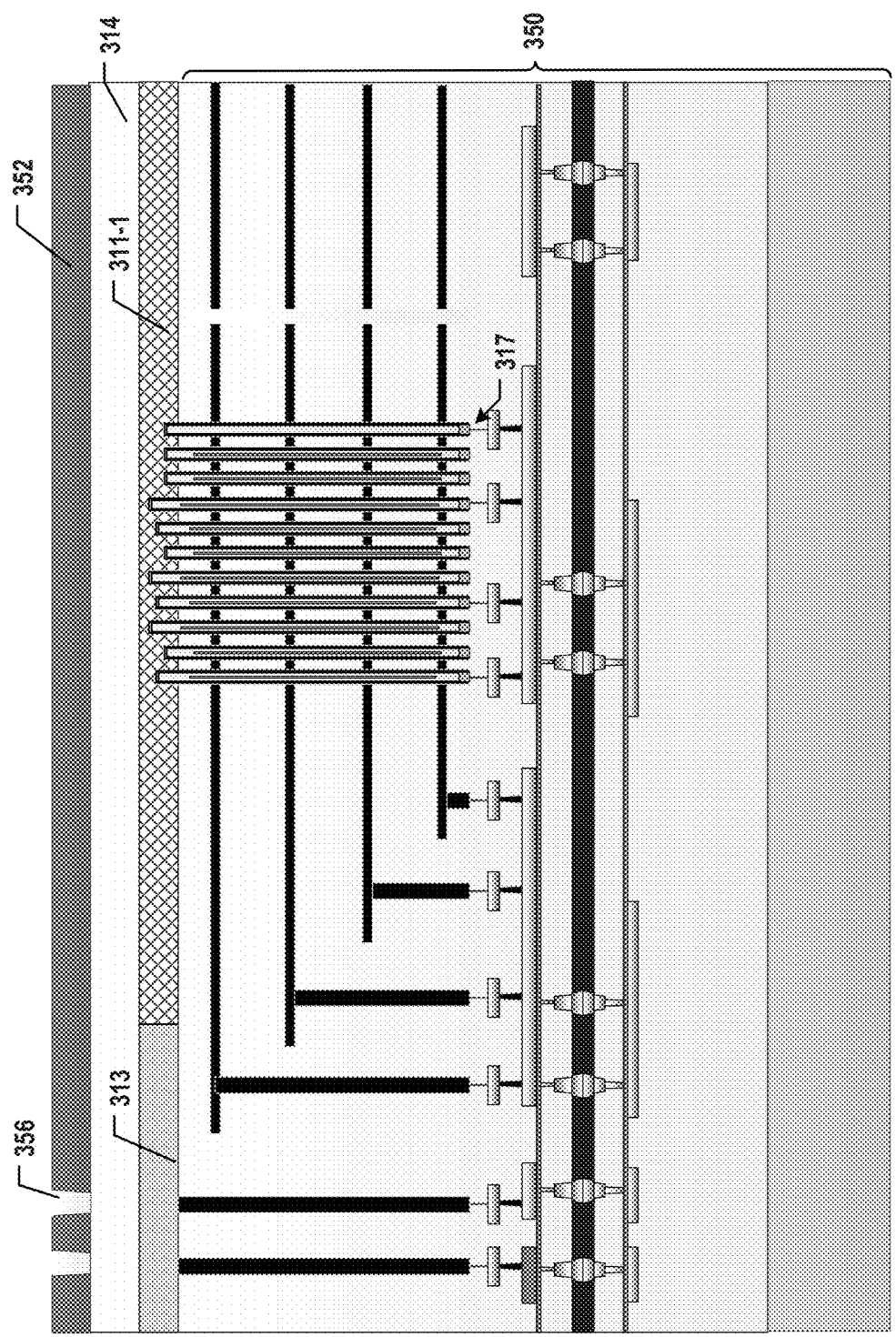
Figure 3H:
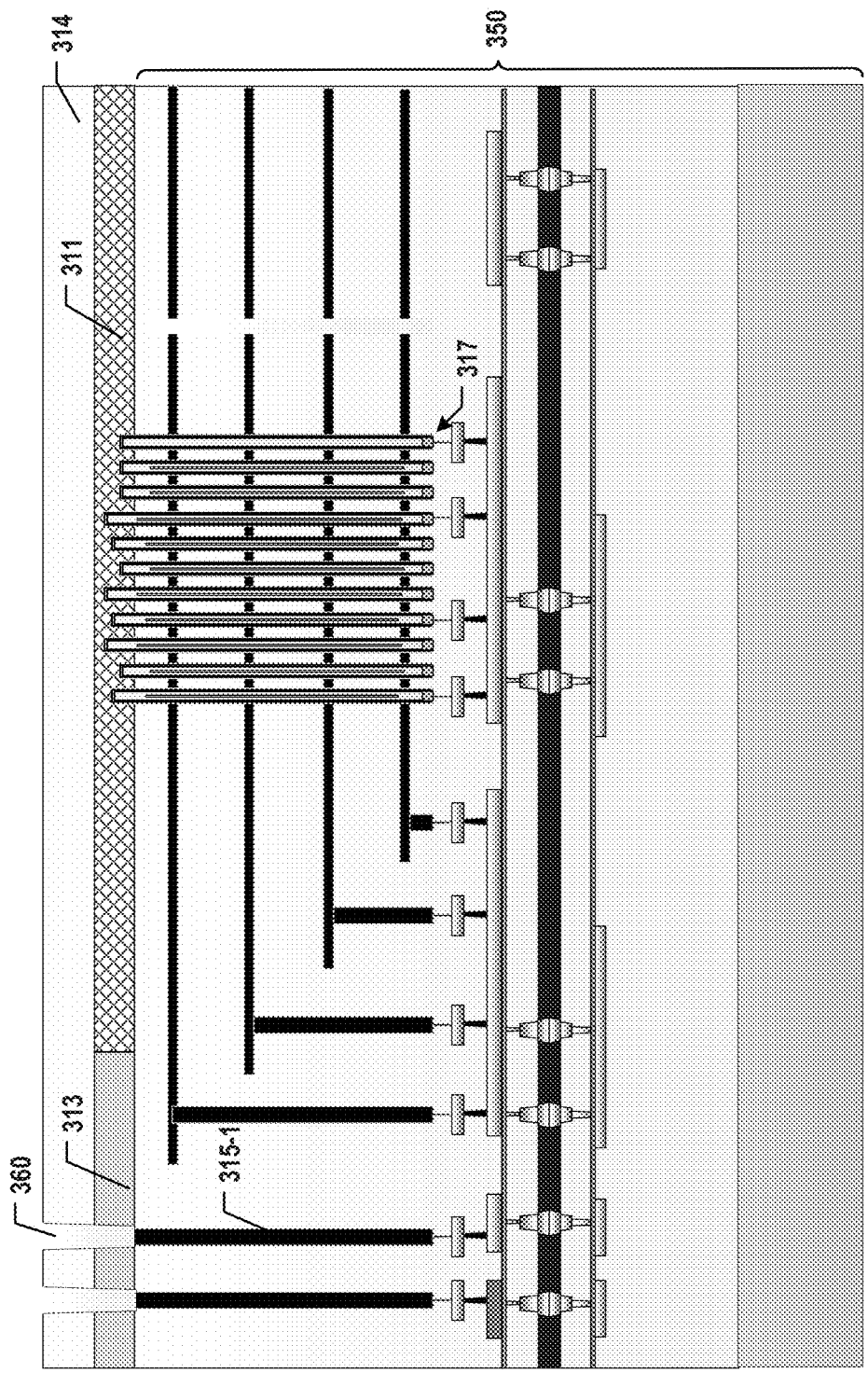
Figure 3I:
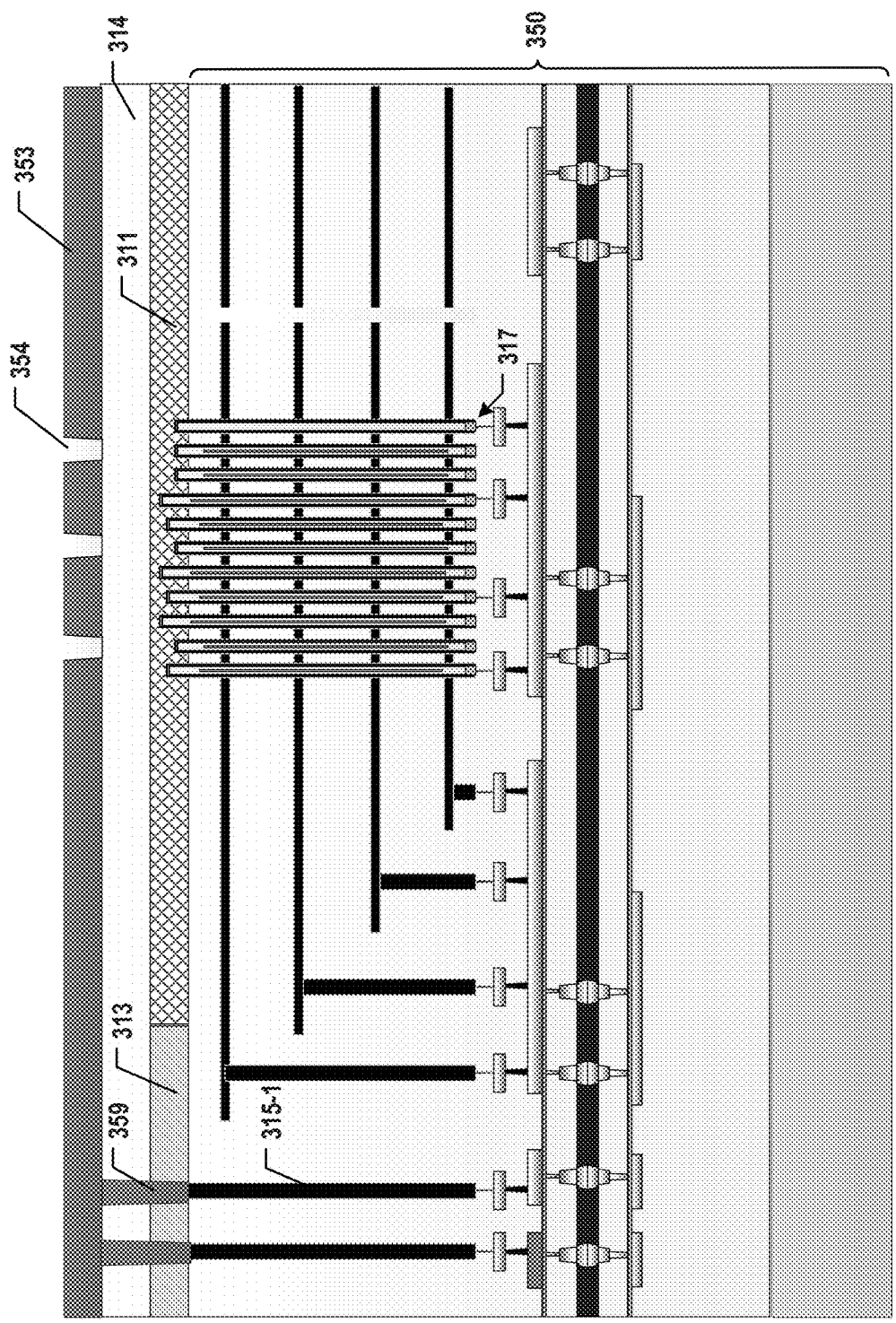
Figure 3J:
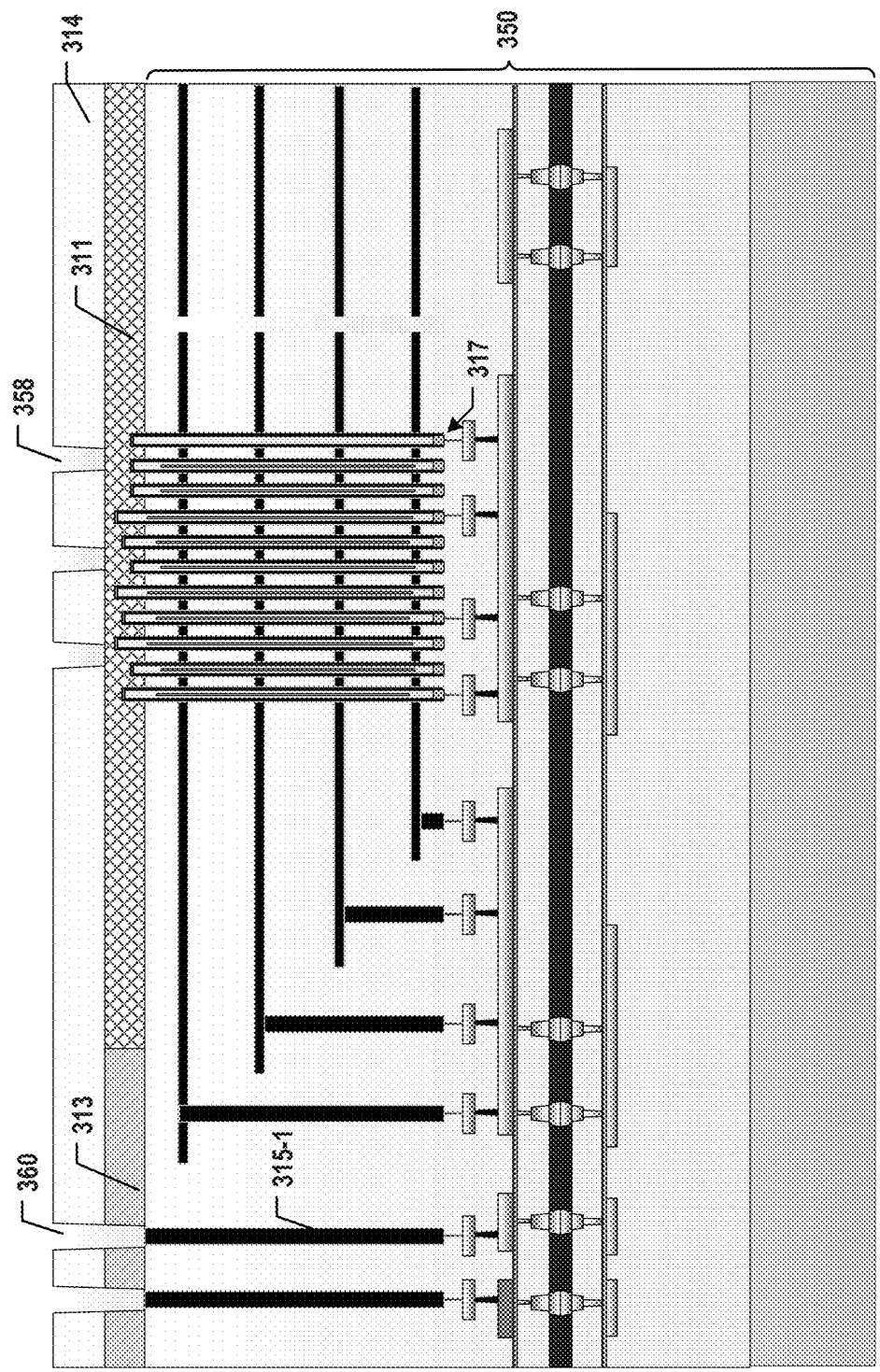
Figure 3K:
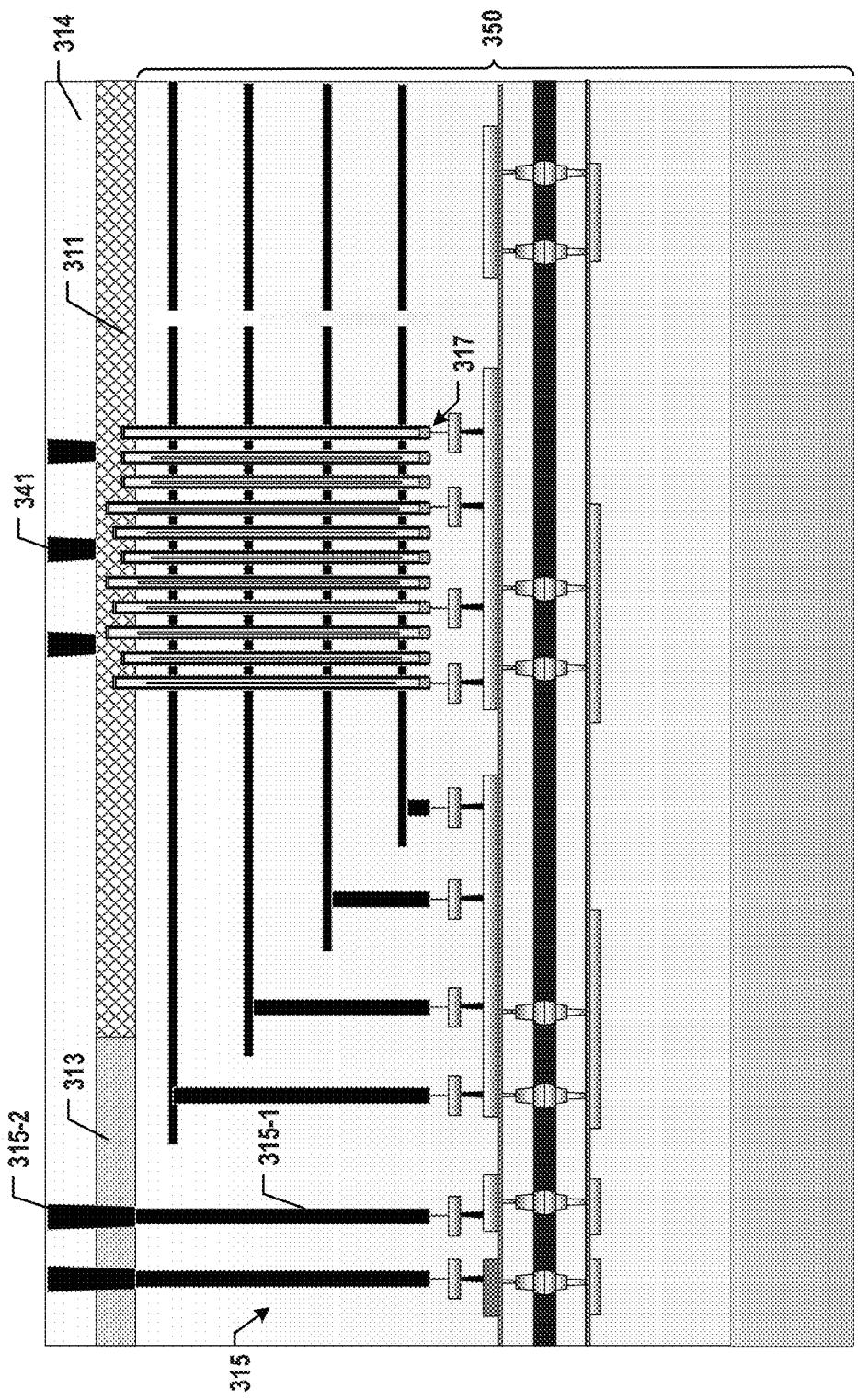
Figure 3L:
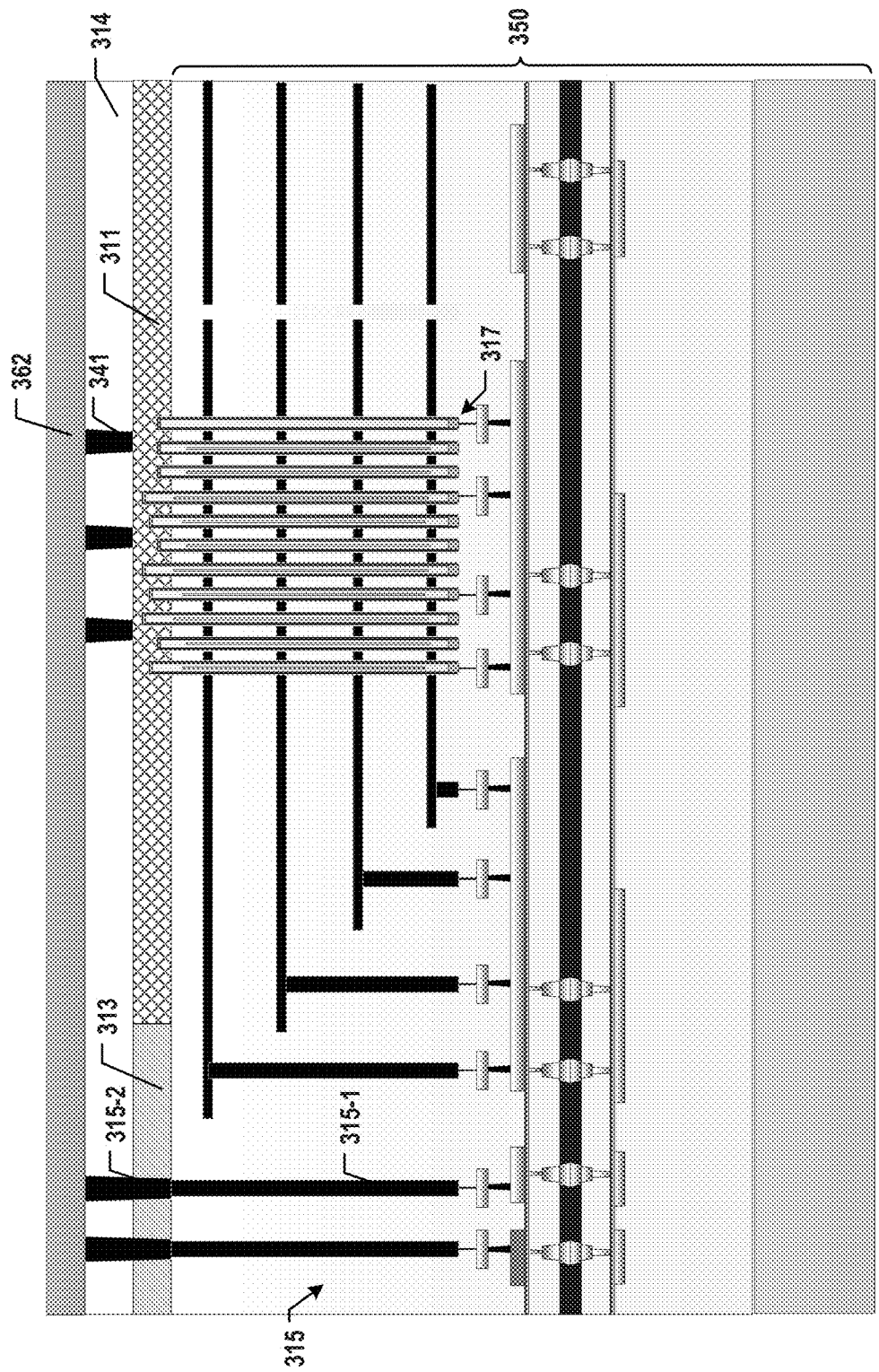
Figure 3M:
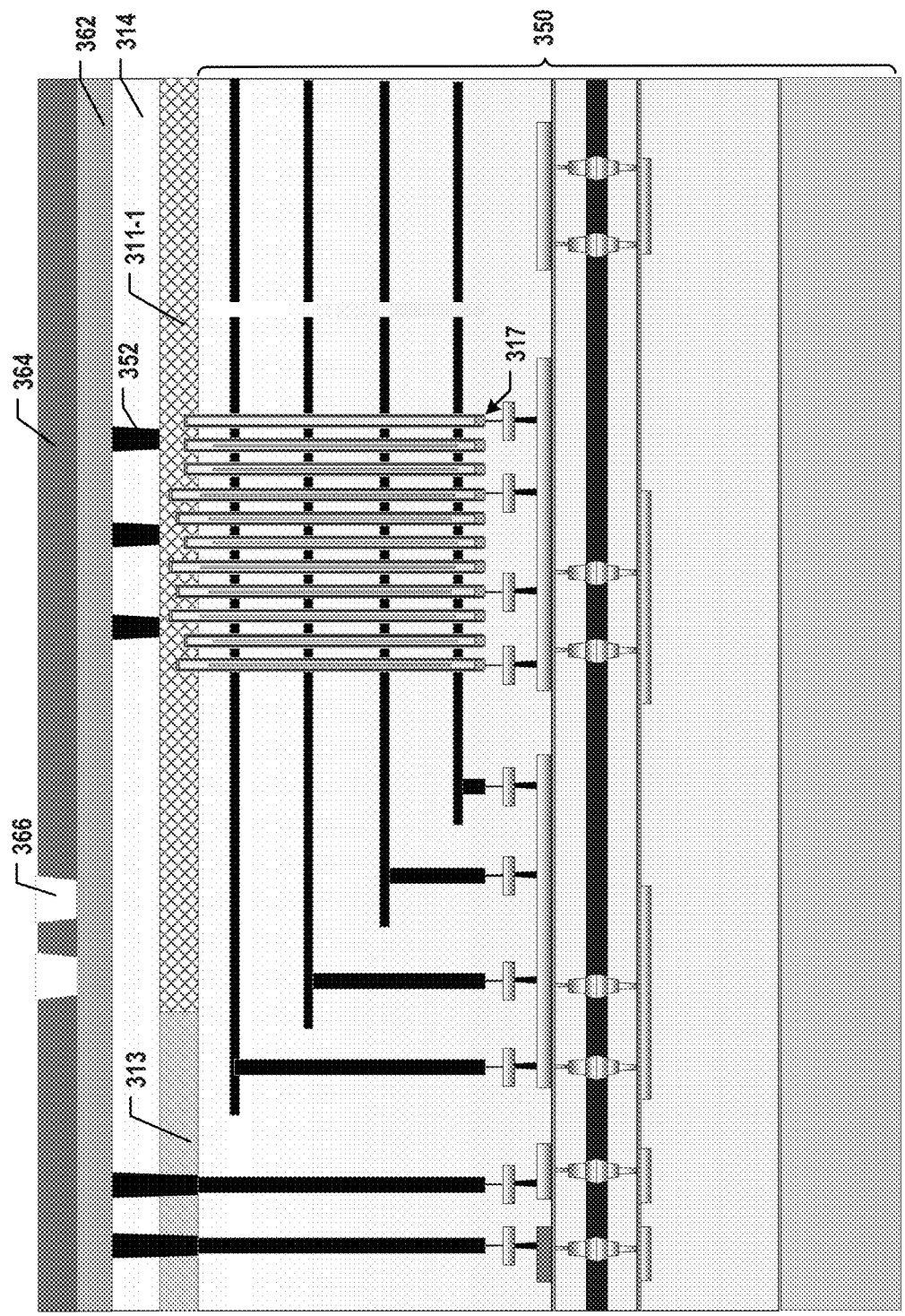
Figure 3N:
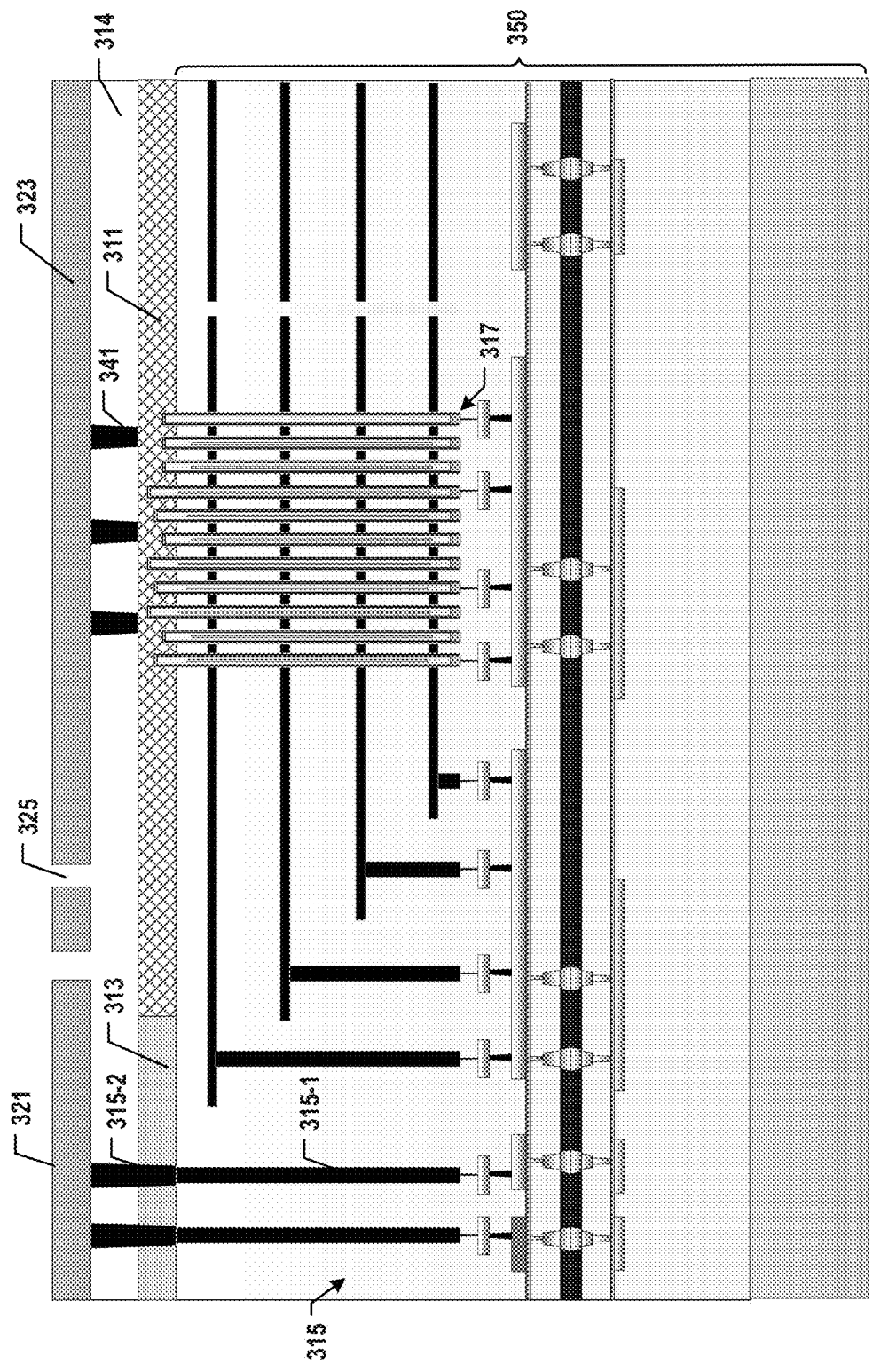
Figure 3O:
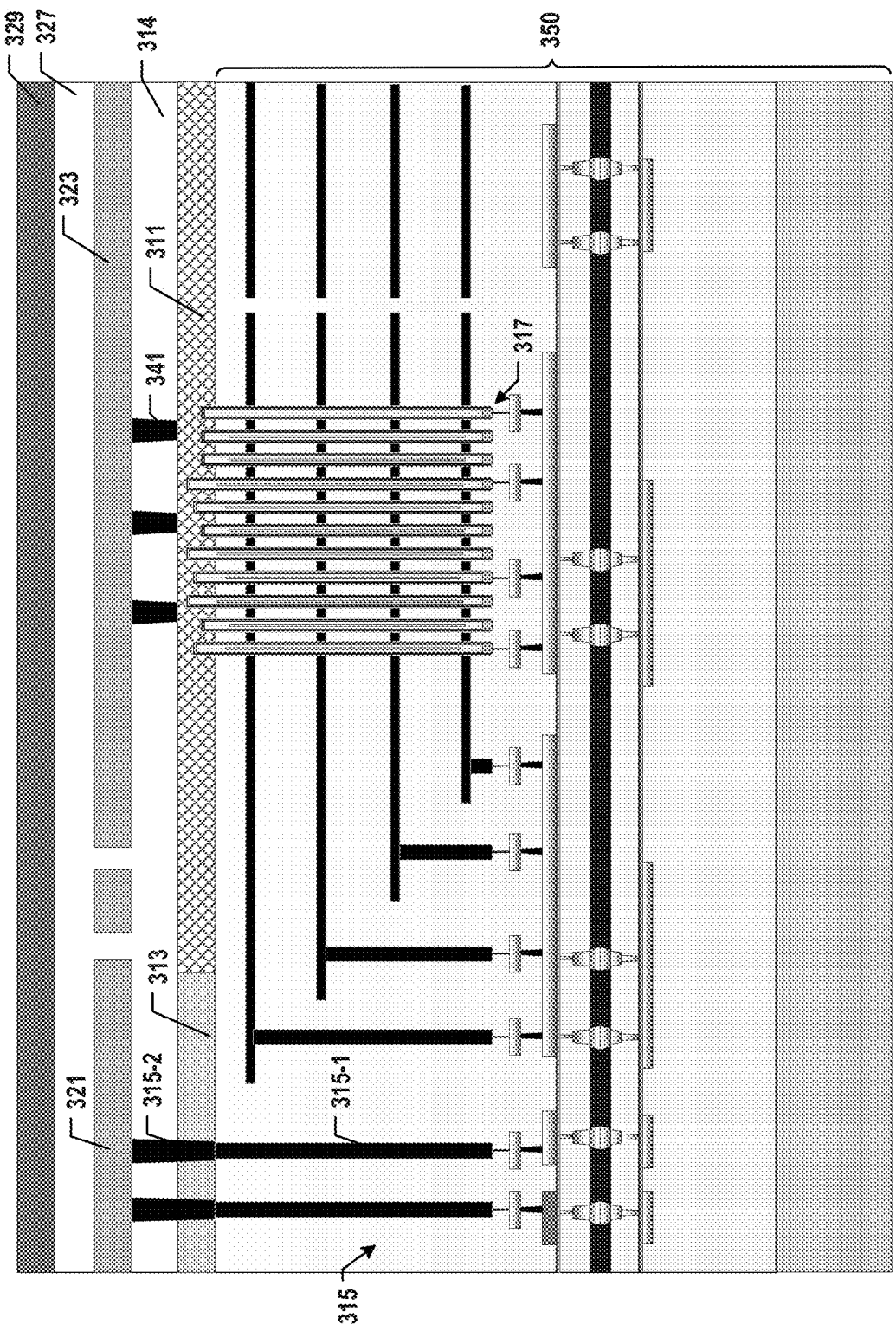
Figure 3P:
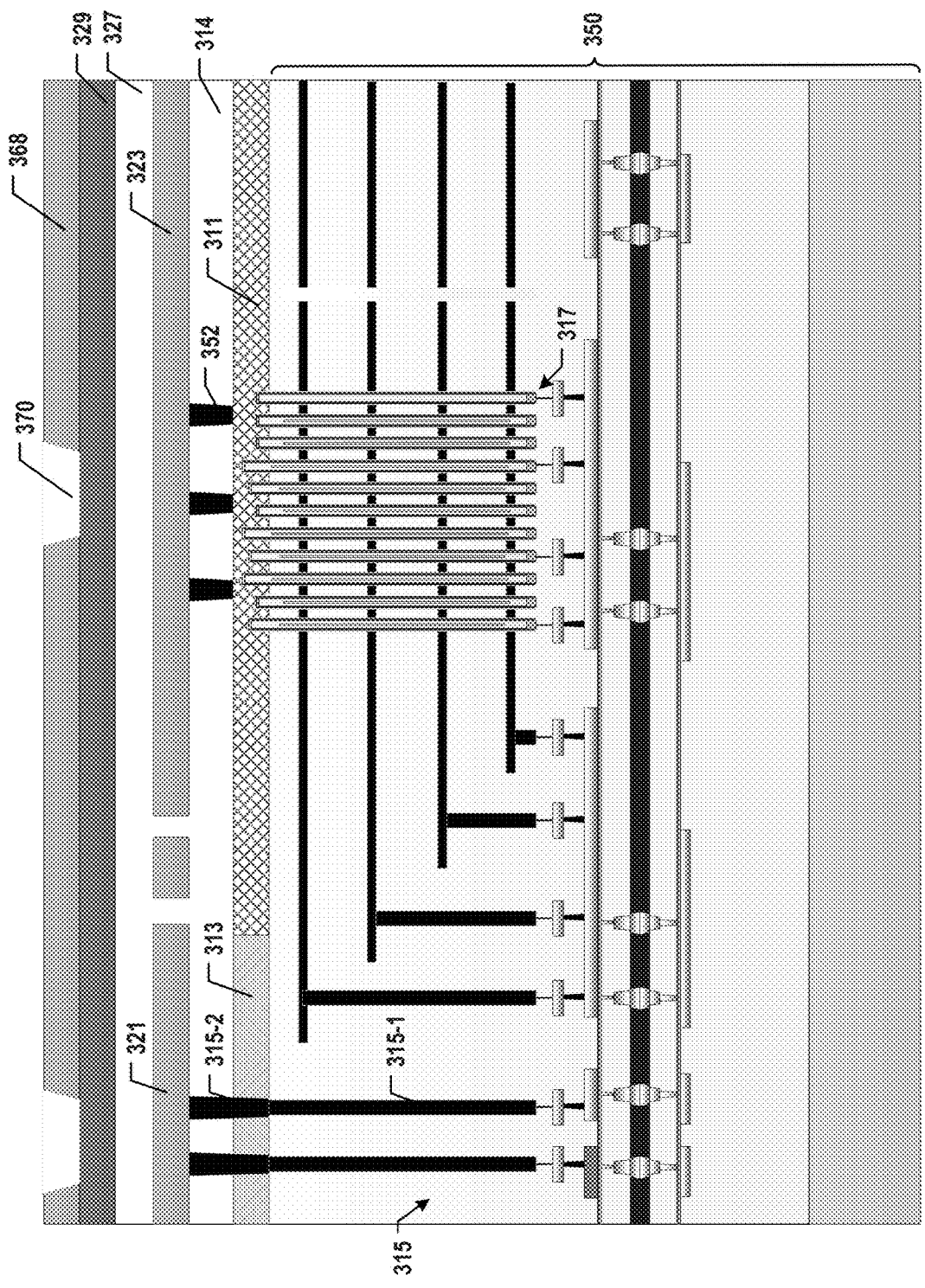
Figure 3Q:
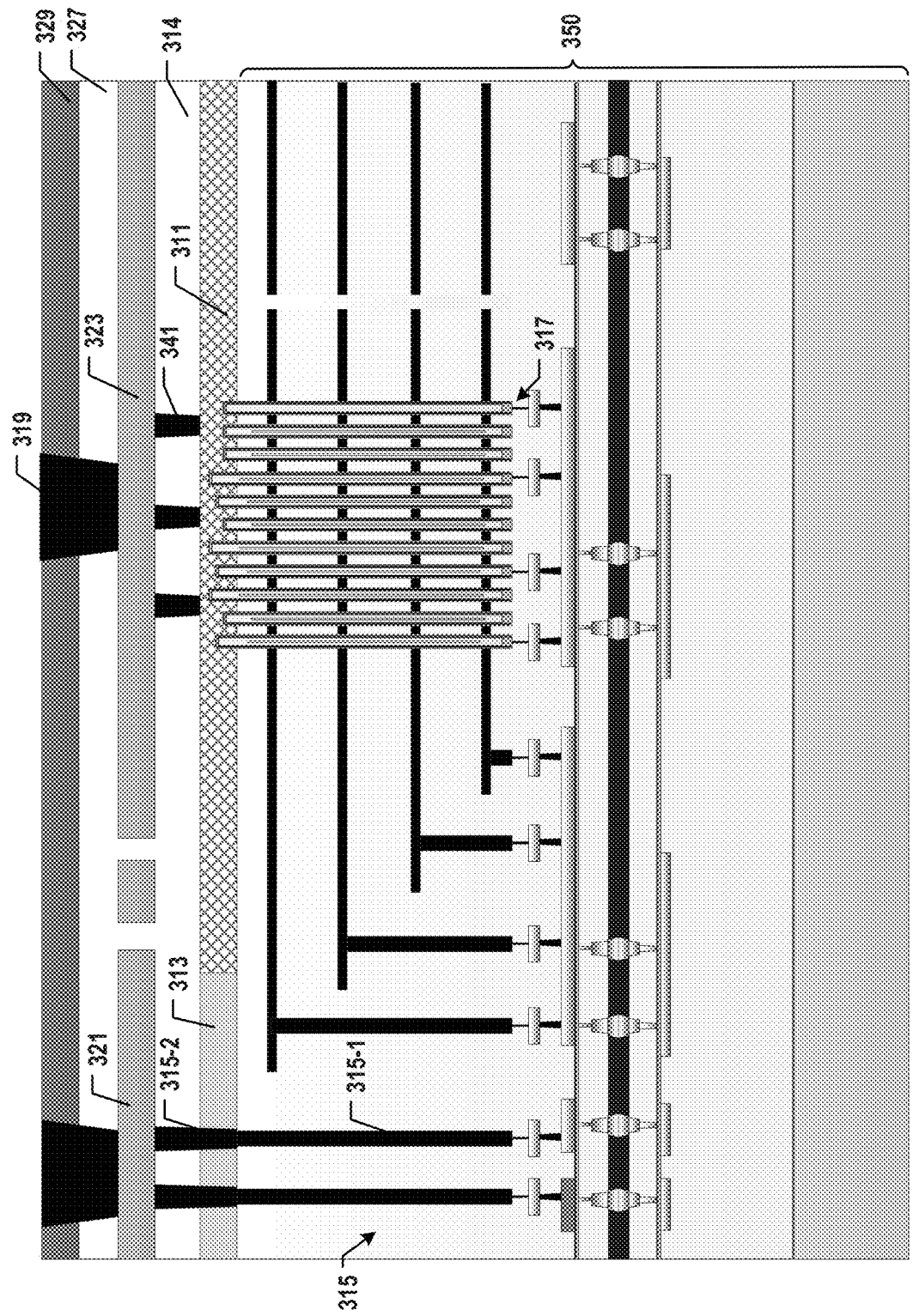
Figure 4:
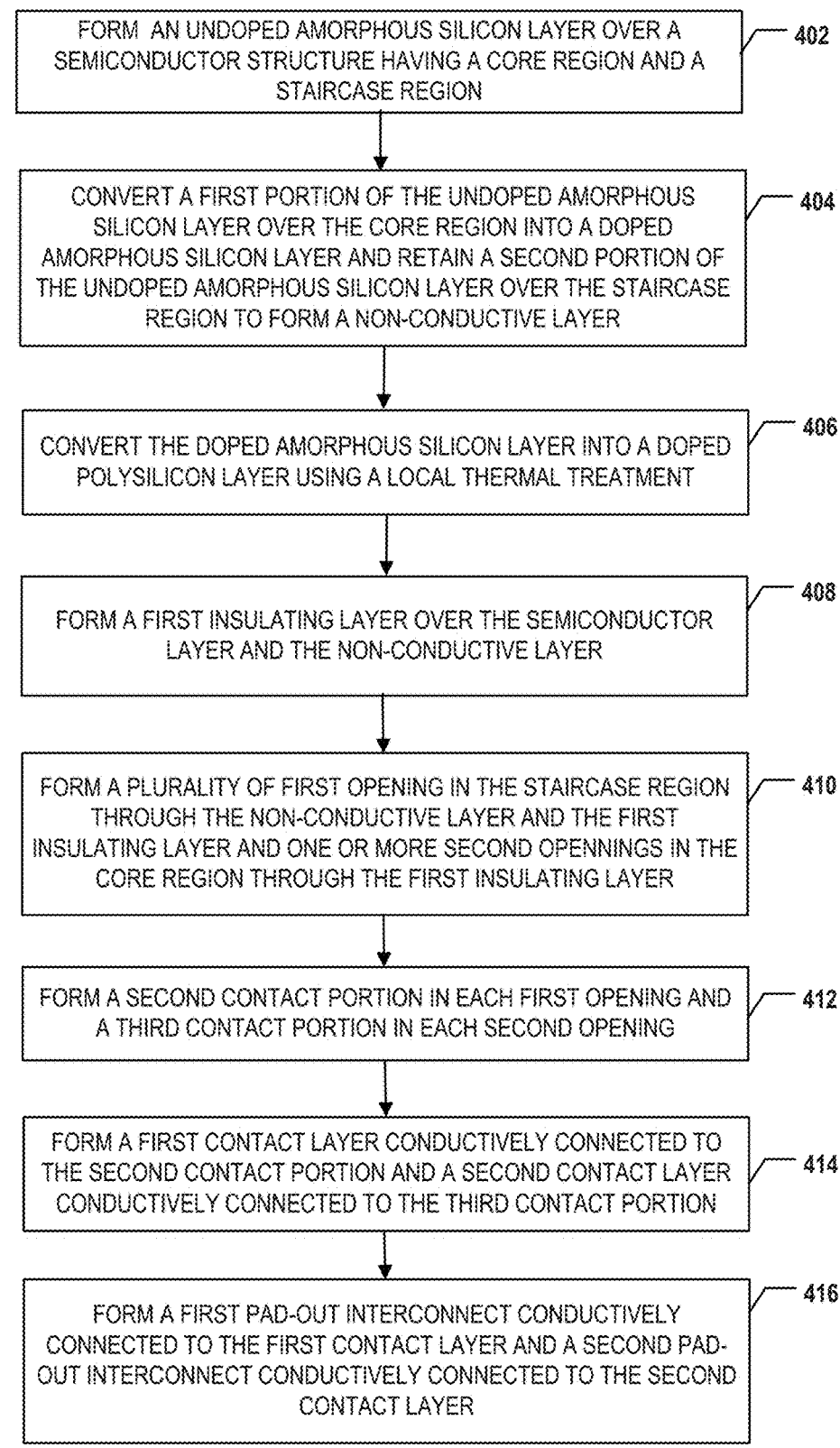
FIG. 4 illustrates a flowchart of a method for forming the 3D memory devices in FIG. 2, according to some aspects of the present disclosure.

FIGS. 3A-3Q illustrate a fabrication process for forming 3D memory device 200, according to some aspects of the present disclosure. FIG. 4 illustrates a flowchart of a method 400 for forming 3D memory devices 200, according to some aspects of the present disclosure. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which an undoped amorphous silicon layer is formed over a semiconductor structure having a core region and a non-array region. FIG. 3A illustrates a corresponding structure.

As shown in FIG. 3A, an undoped amorphous silicon layer 320 is formed over a semiconductor structure 350, which has a core region 108 and a non-array region 110. Semiconductor structure 350 may be an example of 3D memory device 200. As shown in FIG. 3A, semiconductor structure 350 may include part of a first semiconductor structure bonded with a second semiconductor structure at a bonding interface 309. The second semiconductor structure may include a substrate 302, a device layer 304, an interconnect layer 305, and a bonding layer 306. The part of the first semiconductor structure may include a bonding layer 308, an interconnect layer 310, and an array stack 312. Array stack 312 may include interleaved a plurality of gate conductive layers 339 and a plurality of dielectric layers 340. Array stack 312 may also include an array of NAND memory strings 317 extending in the interleaved gate conductive layers 339 and dielectric layers 340. The first semiconductor structure may also include one or more first contact portions 315-1 extending vertically and coupled to interconnect layer 310. First contact portion 315-1 may subsequently form a lower part of a TSV (e.g., contact structure 215). NAND memory strings 317 may be located in core region 108, and first contact portions 315-1 may be located in non-array region 110. The detailed description of each component may be referred to the description of 3D memory device 200 in FIG. 2, and is not repeated herein.

To form the first semiconductor structure, a stack structure, such as a memory stack including interleaved gate conductive layers and dielectric layers, is formed on a first substrate to form array stack 312. In some implementations, the first substrate includes a suitable base material such as silicon. To form the memory stack, in some implementations, a dielectric stack (not shown) including interleaved sacrificial layers (not shown) and the dielectric layers is formed on the first substrate. In some implementations, each sacrificial layer includes a layer of silicon nitride, and each dielectric layer includes a layer of silicon oxide. The interleaved sacrificial layers and dielectric layers can be formed by one or more thin film deposition processes including, but not limited to, chemical vapor deposition (CVD), physical vapor deposition (PVD), atomic layer deposition (ALD), or any combination thereof. The dielectric stack may be repeatedly patterned to form a plurality of stairs in non-array region 110. The memory stack can then be formed by a gate replacement process, e.g., replacing the sacrificial layers with the conductive layers using wet/dry etch of the sacrificial layers selective to the dielectric layers and filling the resulting recesses with the conductive layers. In some implementations, each conductive layer includes a metal layer, such as a layer of W. It is understood that the memory stack may also be formed by alternatingly depositing conductive layers (e.g., doped polysilicon layers) and dielectric layers (e.g., silicon oxide layers) without the gate replacement process in some examples. In some implementations, a pad oxide layer (e.g., thermally grown local oxidation of silicon (LOCOS)), including silicon oxide, is formed between the memory stack and the first substrate. A plurality of contact vias may be formed extending vertically and landed on the stairs to form electrical connections between gate conductive layers 339 and interconnect layer 310 that is to be formed.

NAND memory strings 317 may be formed above the first substrate. Each NAND memory string 317 extends vertically through the dielectric stack (or the memory stack, depending on the fabrication process) to be in contact with the first substrate. In some implementations, the fabrication processes to form NAND memory string 317 include forming a channel hole through the dielectric stack (or the memory stack) and into the first substrate using dry etching/ and or wet etching, such as deep reactive-ion etching (DRIE), followed by subsequently filling the channel hole with a plurality of layers, such as a memory film (e.g., a tunneling layer, a storage layer, and a blocking layer) and a semiconductor layer, using thin film deposition processes such as ALD, CVD, PVD, or any combination thereof.

In some implementations, interconnect layer 310 is formed above the array of NAND memory strings 317 on the first substrate. Interconnect layer 310 can include a first plurality of interconnects in one or more ILD layers. Interconnect layer 310 can include interconnects of MEOL and/or BEOL in a plurality of ILD layers to make electrical connections with NAND memory strings 317. In some implementations, interconnect layer 310 includes multiple ILD layers and interconnects therein formed in multiple processes. For example, the interconnects in interconnect layer 310 can include conductive materials deposited by one or more thin film deposition processes including, but not limited to, CVD, PVD, ALD, electroplating, electroless plating, or any combination thereof. Fabrication processes to form interconnects can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. The ILD layers and interconnects illustrated can be collectively referred to as interconnect layer 310. In some implementations, the interconnects in interconnect layer 310 include W, which has a relatively high thermal budget among conductive metal materials to sustain later high-temperature processes.

In some implementations, bonding layer 308 is formed above interconnect layer 310. Bonding layer 308 can include a plurality of first bonding contacts 331 surrounded by dielectrics. In some implementations, a dielectric layer is deposited on the top surface of interconnect layer 310 by one or more thin film deposition processes including, but not limited to, CVD, PVD, ALD, or any combination thereof. First bonding contacts 331 can then be formed through the dielectric layer and in contact with the interconnects in interconnect layer 310 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

To form the second semiconductor structure, device layer 304 is formed on substrate 302 (e.g., a second substrate). Device layer 304 may include a plurality of transistors on substrate 302. Substrate 302 can be a silicon substrate having single crystalline silicon. The transistors can be formed by a plurality of processes including, but not limited to, photolithography, dry/wet etch, thin film deposition, thermal growth, implantation, CMP, and any other suitable processes. In some implementations, doped regions are formed in substrate 302 by ion implantation and/or thermal diffusion, which function, for example, as wells and source/drain regions of the transistors. In some implementations, isolation regions (e.g., shallow trench isolation (STIs)) are also formed in the substrate 302 by wet/dry etch and thin film deposition. The transistors may function as part or all of the peripheral circuits for controlling NAND memory strings 317. It is understood that the details of fabricating transistors may vary depending on the types of the transistors and thus, are not elaborated for ease of description.

In some implementations, interconnect layer 305 is formed above the transistor on the substrate 302. Interconnect layer 305 can include a plurality of interconnects in one or more ILD layers. As illustrated in FIG. 3, interconnect layer 305 can be formed above the transistors in device layer 304. Interconnect layer 305 can include interconnects of MEOL and/or BEOL in a plurality of ILD layers to make electrical connections with the transistors. In some implementations, interconnect layer 305 includes multiple ILD layers and interconnects therein formed in multiple processes. In some implementations, first contact portions 315-1 may be formed, in non-array region 110, extending in array stack 312 and coupled to interconnects in interconnect layer 305. The formation of first contact portions 315-1 may include photolithography, etching, and deposition. For example, first contact portions 315-1 and the interconnects in interconnect layer 305 can include conductive materials deposited by one or more thin film deposition processes including, but not limited to, CVD, PVD, ALD, electroplating, electroless plating, or any combination thereof. Fabrication processes to form interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects can be collectively referred to as interconnect layer 305. In some implementations, the interconnects in interconnect layer 305 include W, which has a relatively high thermal budget among conductive metal materials to sustain later high-temperature processes.

In some implementations, bonding layer 306 is formed above interconnect layer 305. Bonding layer 306 can include a plurality of second bonding contacts 333 surrounded by dielectrics. In some implementations, a dielectric layer is deposited on the top surface of interconnect layer 305 by one or more thin film deposition processes including, but not limited to, CVD, PVD, ALD, or any combination thereof. Second bonding contacts 333 can then be formed through the dielectric layer and in contact with the interconnects in interconnect layer 305 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing an adhesion (glue) layer, a barrier layer, and/or a seed layer before depositing the conductor.

As illustrated in FIG. 3A, the first semiconductor structure (e.g., array stack 312 and NAND memory strings 317 formed therethrough) are flipped upside down. Bonding layer 308 facing down is bonded with bonding layer 306 facing up, i.e., in a face-to-face manner, thereby forming bonding interface 309. That is, the first and second bonding contacts in bonding layers 308 and 306 are bonded at bonding interface 309. In some implementations, a treatment process, e.g., plasma treatment, wet treatment and/or local thermal treatment, is applied to bonding surfaces prior to bonding. As a result of the bonding, e.g., hybrid bonding, the first and second bonding contacts 331 and 333 on opposite sides of bonding interface 309 can be inter-mixed. After the bonding, first bonding contacts 331 in bonding layer 308 and second bonding contacts 333 in bonding layer 306 are aligned and in contact with one another, such that array stack 312 and NAND memory strings 317 formed therethrough can be coupled to the transistors through the bonded bonding contacts across bonding interface 309, according to some implementations. The first substrate may then be partially or fully removed to expose source ends of NAND memory strings 317. In some implementations, the removal of the first substrate includes a suitable etching process (e.g., dry etch and/or wet etch) and/or a planarization process (e.g., chemical mechanical polishing or CMP). The bonded chip, with the first substrate partially or fully removed, may be referred to as semiconductor structure 350.

Undoped amorphous silicon layer 320 may be deposited over semiconductor structure 350 on the side/surface that the source ends of NAND memory strings 317 are exposed. Undoped amorphous silicon layer 320 may be in contact with at least the source ends of a plurality of, e.g., all, NAND memory strings 317 in core region 108. In some implementations, undoped amorphous silicon layer 320 covers and be in contact with at least one, e.g., all, first contact portions 315-1 in non-array region 110. For example, undoped amorphous silicon layer 320 may cover both core region 108 and non-array region 110. In some implementations, undoped amorphous silicon layer 320 is deposited using a low-temperature deposition process, such as low-temperature chemical vapor deposition (CVD). For example, the deposition temperature may range from 400 degrees Celsius to 450 degrees Celsius. In some implementations, the thickness of undoped amorphous silicon layer 320 ranges from 100 nm to 600 nm. In various implementations, the thickness of undoped amorphous silicon layer 320 is controlled to be in a desirable range such that the subsequent local thermal treatment, e.g., laser anneal process, can fully convert a selected area. In some implementations, the selected area is converted from the respective top surface to the respective bottom surface.

Method 400 proceeds to operation 404, in which a first portion of the undoped amorphous silicon layer in the non-array region is retained to form a non-conductive layer, and a second portion of the undoped amorphous silicon layer in the core region is converted into a doped amorphous silicon portion using an ion implantation process. FIGS. 3B-3D illustrates corresponding structures.

As shown in FIG. 3B, a patterned photoresist layer 351 may be formed exposing a first portion of undoped amorphous silicon layer 320a and over a second portion of undoped amorphous silicon layer 320b. Second portion of undoped amorphous silicon layer 320b may cover a plurality of, e.g., all, first contact portions 315-1 in non-array region 110, and first portion of undoped amorphous silicon layer 320a may cover the source ends of all NAND memory strings 317 in core region 108. A lateral dimension L1 of second portion of undoped amorphous silicon layer 320b (or patterned photoresist layer 351), e.g., in the x-direction and/or y-direction, may be sufficiently large to cover at least a plurality of, e.g., all, first contact portions 315-1. For example, lateral dimension L1 may be equal to or less than a lateral dimension of non-array region 110 in the x-direction. In some implementations, lateral dimension L1 may be equal to or less than a lateral dimension of the staircase region. In some embodiments, latera dimension L1, e.g., along the x-direction and/or y-direction, may be equal to or greater than three times the thickness of undoped amorphous silicon layer 320a in the z-direction. In some implementations, the area of second portion of undoped amorphous silicon layer 320b may cover the total area of all first contact portions 315-1 in all lateral directions. Meanwhile, a lateral dimension L2 of first portion of undoped amorphous silicon layer 320a may be greater than or equal to the lateral dimensions of all NAND memory strings 317. For example, an area of first portion of undoped amorphous silicon layer 320a may fully cover all NAND memory strings 317 and thus be equal to or greater than the total area of all NAND memory strings 317. In some implementations, lateral dimension L2 is equal to or greater than a lateral dimension of core region 108 in the x-direction. Patterned photoresist layer 351 may be formed by coating a photoresist layer over undoped amorphous silicon layer 320 and performing a photolithography process to remove the portion of the photoresist layer over first portion of undoped amorphous silicon layer 320a.

As shown in FIG. 3C, first portion of undoped amorphous silicon layer 320a may be converted to a doped amorphous silicon layer 311a. In some implementations, the conversion of undoped amorphous silicon to doped amorphous silicon includes an ion implantation process. In some implementation, the dopants include N-type dopants that include, e.g., phosphorus and/or arsenic. Second portion of undoped amorphous silicon layer 320b, covered by patterned photoresist layer 351, may remain undoped. As shown in FIG. 3D, patterned photoresist layer 351 may be removed, e.g., using an ashing process and/or a wet etch. Second portion of undoped amorphous silicon layer 320b may be referred to as a non-conductive layer 313.

Referring back to FIG. 4, method 400 proceeds to operation 406, in which the doped amorphous silicon layer is converted to a doped polysilicon layer using a laser anneal process. FIG. 3E illustrates a corresponding structure.

As shown in FIG. 3E, doped amorphous silicon layer 311a may be converted to a doped polysilicon layer, referred to as a semiconductor layer 311. The conversion of doped amorphous silicon to doped polysilicon may include a local thermal treatment, such as a laser anneal process. The local thermal treatment may be confined in a desired controlled area, and would not affect other thermal-sensitive structures, such as bonding contacts 331 and 333 at bonding interface 209 and other copper structures/interconnects. Doped amorphous silicon layer 311a may crystalize during the local thermal treatment and form the doped polysilicon layer, e.g., semiconductor layer 311. In some implementations, the temperature of the laser anneal process may range from 1300 degrees Celsius to 1700 degrees Celsius. In some implementations, the laser anneal process includes a plurality of laser pulses, each having a pulse time of 100 ns (i.e., nanoseconds) to 300 ns.

The local thermal treatment, e.g., the laser anneal process, may be controlled to perform only on doped amorphous silicon layer 311a. A lateral dimension L2 of semiconductor layer 211 may be greater than or equal to the total lateral dimensions of all NAND memory strings 317. For example, an area of semiconductor layer 311 may fully cover all NAND memory strings 317 and thus be equal to or greater than the total area of all NAND memory strings 317.

Referring back to FIG. 4, method 400 proceeds to operation 408, in which a first insulating layer is formed over the non-conductive layer and the semiconductor layer. FIG. 3F illustrates a corresponding structure.

As shown in FIG. 3F, an insulating material may be deposited over semiconductor layer 311 and non-conductive layer 313, forming a first insulating layer 314. The insulating material, such as a dielectric material, may include silicon oxide, silicon nitride, silicon oxynitride, and/or other low-k dielectrics. The insulating material may be deposited using a suitable deposition method such as CVD, PVD, and/or ALD. In some implementations, the deposition of the insulating material does not include ALD.

Referring back to FIG. 4, method 400 proceeds to operation 410, in which a plurality of first opening is formed through the non-conductive layer and the first insulating layer in the non-array region, and one or more second opening are formed in the first insulating layer in the core region. FIGS. 3G-3J illustrate corresponding structures.

FIGS. 3G-3J illustrate a process in which first openings (360 shown in FIG. 3H) and the second openings (358 shown in FIG. 3J) are formed separately, e.g., using different patterning processes. As shown in FIG. 3G, a first patterned photoresist layer 352 may first be formed over first insulating layer 314 in core region 108 and non-array region 110. In some implementations, first opening 360 may first be formed by patterning non-conductive layer 313 and first insulating layer 314 using first patterned photoresist layer 352 that includes openings 356 for forming first openings 360 but not second openings 358. As shown in FIG. 3H, non-conductive layer 313 and first insulating layers 314 may then be etched by a first etching process, in non-array region 110, to form first openings 360 each aligned with a respective first contact portion 315-1. First patterned photoresist layer 352 may be removed.

As shown in FIG. 3I, another layer of photoresist layer may then be spined onto first insulating layer 314 and fill first opening 360, forming a photoresist portion 359 in each first opening 360. The photoresist layer may be patterned to form a second patterned photoresist layer 353 that includes one or more openings 354 each for forming a second opening 358 in first insulating layer 314. A second etching process may be performed, using second patterned photoresist layer 353 as the etch mask, to form second opening 358 in first insulating layer 314. Second patterned photoresist layer 353 and photoresist portions 359 may then be removed, as shown in FIG. 3J. In some implementations, the first etching process and the second etching process may each include a suitable dry etch and/or wet etch. In some implementations, the removal of photoresist may include an ashing process and/or a wet etch.

In some other implementations, first openings 360 and second openings 358 are formed in the same patterning process. For example, a patterned photoresist layer, formed over first insulating layer 314, may include one or more openings for forming first openings 360 and one or more openings for forming second openings 358. The openings may each be in contact with first insulating layer 314. In some implementations, one or more openings may each be aligned with a respective first contact portion 315-1 in the z-direction, and one or more openings may each be over source ends of NAND memory strings 317. The patterned photoresist layer may be formed by coating a photoresist layer over first insulating layer 314 and performing a photolithography process, forming the openings. A suitable etching process, e.g., dry etch and/or wet etch, may be performed, using the patterned photoresist layer as the etch mask, to form a plurality of first openings 360 through non-conductive layer 313 and first insulating layer 314 and each in contact with a respective first contact portion 315-1. In the same etching process, one or more second openings 358 are formed in first insulating layer 314 and in contact with semiconductor layer 311. The patterned photoresist layer may then be removed, e.g., using an ashing process and/or a wet etch.

Referring back to FIG. 4, method 400 proceeds to operation 412, in which a second contact portion is formed in each first opening and a third contact portion is formed in each second opening. FIG. 3K illustrates a corresponding structure.

As shown in FIG. 3K, a second contact portion 315-2 is formed in each first opening 360, and a third contact portion 341 is formed in each second opening 358. Second contact portion 315-2 may each be in contact with the respective first contact portion 315-1. In some implementations, each first contact portion 315-1 and the respective second contact portion 315-2 may form a contact structure 315, e.g., a TSC. Second and third contact portions 315-2 and 341 may each include tungsten (W), cobalt (Co), copper (Cu), aluminum (Al), polysilicon, doped silicon, silicides, or any combination thereof. In some implementations, second and third contact portions 315-2 and 341 may be formed by depositing a layer of conductive material to fill second and third openings 360 and 358, and perform a recess etch (e.g., a blank etch) to remove any excess conductive material on first insulating layer 314. In some implementations, the deposition of the conductive material includes CVD, PVD, ALD, electroplating, electroless plating, or a combination thereof. The recess etch may include a suitable dry etch and/or wet etch.

Referring back to FIG. 4, method 400 proceeds to operation 414, in which a first contact layer is formed conductively connected to the second contact portion and a second contact layer is formed to be conductively connected to the third contact portion. FIGS. 3L-3N illustrate corresponding structures.

As shown in FIG. 3L, a contact material layer 362 may be formed in contact with second contact portions 315-2 and third contact portions 341. Contact material layer 362 may include tungsten (W), cobalt (Co), copper (Cu), aluminum (Al), polysilicon, doped silicon, silicides, or any combination thereof. In some implementations, contact material layer 362 may be deposited using CVD, PVD, ALD, electroplating, electroless plating, or a combination thereof.

As shown in FIG. 3M, a patterned photoresist layer 364 may be formed over contact material layer 362. Patterned photoresist layer 364 may include one or more openings 366 for patterning contact material layer 362 to disconnect a portion of contact material layer 362 conductively connected to third contact portions 341 (e.g., NAND memory strings 317) from another portion of contact material layer 362 conductively connected to contact structures 315. In some implementations, in the x-y plane, openings 366 may be located between third contact portions 341 and contact structures 315 and may be in contact with contact material layer 362. Patterned photoresist layer 364 may be formed by spinning on a photoresist layer over contact material layer 362 and patterning the photoresist layer using a photolithography process.

As shown in FIG. 3N, a first contact layer 321 is formed conductively connected to second contact portions 315-2 (or contact structures 315), and a second contact layer 323 is formed conductively connected to third contact portions 341. First contact layer 321 may be disconnected from second contact layer 323 by one or more openings 325 between and disconnecting first and second contact layers 321 and 323. Openings 325 may be formed by etching contact material layer 362 using patterned photoresist layer 364 as the etch mask. In some implementations, the etching of contact material layer 362 includes a suitable dry etch and/or wet etch. Patterned photoresist layer 364 may then be removed using an ashing process.

Referring back to FIG. 4, method 400 proceeds to operation 416, in which a first pad-out interconnect is conductively connected to the first contact layer and a second pad-out interconnect is conductively connected to the second contact layer. FIGS. 3O-3Q illustrate corresponding structures.

As shown in FIG. 3O, dielectric materials may be deposited over first and second contact layers 321 and 323 to form one or more dielectric layers. The dielectric material may fill openings 325 to provide insulation between first and second contact layers 321 and 323. In some implementations, a first dielectric material is deposited in contact with first and second contact layers 321 and filling openings 325, forming a first dielectric layer 327. A second dielectric material may be deposited over first dielectric layer 327, forming a second dielectric layer 329. In some implementations, first dielectric layer 327 includes silicon oxide, and second dielectric layer 329 includes silicon nitride. The deposition of first and second dielectric materials may each include CVD, PVD, ALD, or a combination thereof.

As shown in FIG. 3P, a patterned photoresist layer 368 may be formed over second dielectric layer 329. Patterned photoresist layer 368 may include one or more openings 370 for patterning first and second dielectric layers 327 and 329 and forming pad-out interconnects. In some implementations, openings 370 may be located above contact structures 315 and third contact portions 341, respectively. Patterned photoresist layer 368 may be formed by spinning on a photoresist layer over second dielectric layer 329 and patterning the photoresist layer using a photolithography process. First and second dielectric layers 327 and 329 may be etched, using patterned photoresist layer 368 as the etch mask, to form respective openings (not shown) in first and second dielectric layers 327 and 329. At least one opening may be in contact with first contact layer 321, and at least one opening may be in contact with second contact layer 323. Patterned photoresist layer 368 may be removed using an ashing process.

As shown in FIG. 3Q, a plurality of pad-out interconnects 319 are formed in the openings. Pad-out interconnects 319 may include at least one first pad-out interconnect 319 in contact with first contact layer 321, and at least one second pad-out interconnect 319 in contact with second contact layer 323. Pad-out interconnects 319 may include tungsten (W), cobalt (Co), copper (Cu), aluminum (Al), polysilicon, doped silicon, silicides, or any combination thereof. In some implementations, pad-out interconnects 319 may be deposited using CVD, PVD, ALD, electroplating, electroless plating, or a combination thereof. In some implementations, a recess etch, e.g., dry etch and/or wet etch, is performed after the deposition to remove any excess conductive material on second dielectric layer 329.

Figure 5:
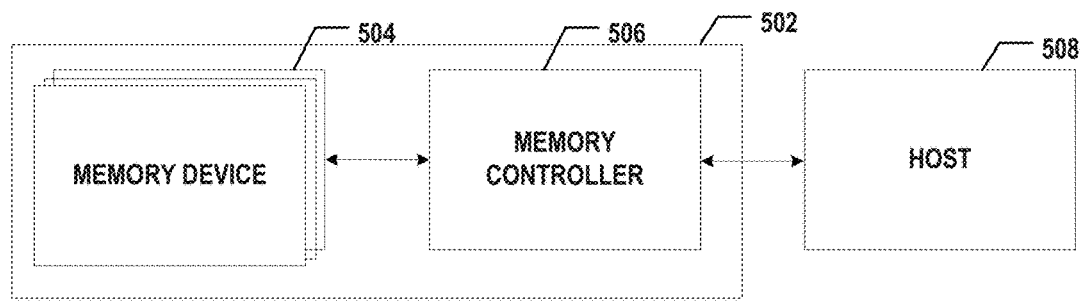
FIG. 5 illustrates a block diagram of an exemplary system having a memory device, according to some aspects of the present disclosure.

FIG. 5 illustrates a block diagram of a system 500 having a memory device, according to some aspects of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 5, system 500 can include a host 508 and a memory system 502 having one or more memory devices 504 and a memory controller 506. Host 508 can be a processor of an electronic device, such as a central processing unit (CPU), or a system-on-chip (SoC), such as an application processor (AP). Host 508 can be configured to send or receive the data to or from memory devices 504.

Memory device 504 can be any memory devices disclosed herein, such as 3D memory device 200. In some implementations, each memory device 504 includes an array of memory cells, a peripheral circuit of the array of memory cells. The array of memory cells and the peripheral circuit are stacked over one another in different planes, as described above in detail.

Memory controller 506 is coupled to memory device 504 and host 508 and is configured to control memory device 504, according to some implementations. Memory controller 506 can manage the data stored in memory device 504 and communicate with host 508. In some implementations, memory controller 506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 506 can be configured to control operations of memory device 504, such as read, erase, and program operations. In some implementations, memory controller 506 is configured to control the array of memory cells through the first peripheral circuit and the second peripheral circuit. Memory controller 506 can also be configured to manage various functions with respect to the data stored or to be stored in memory device 504 including, but not limited to bad-block management, garbage collection, logical-to-physical address conversion, wear leveling, etc. In some implementations, memory controller 506 is further configured to process error correction codes (ECCs) with respect to the data read from or written to memory device 504. Any other suitable functions may be performed by memory controller 506 as well, for example, formatting memory device 504. Memory controller 506 can communicate with an external device (e.g., host 508) according to a particular communication protocol. For example, memory controller 506 may communicate with the external device through at least one of various interface protocols, such as a USB protocol, an MIVIC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 6A, 6B:
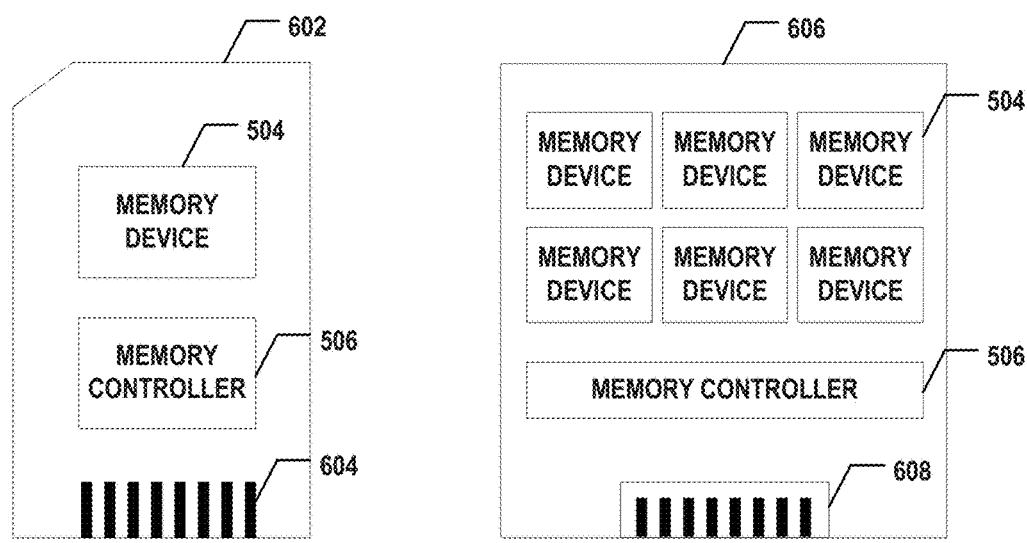
FIG. 6A illustrates a diagram of an exemplary memory card having a memory device, according to some aspects of the present disclosure.
FIG. 6B illustrates a diagram of an exemplary solid-state drive (SSD) having a memory device, according to some aspects of the present disclosure.

Memory controller 506 and one or more memory devices 504 can be integrated into various types of storage devices, for example, be included in the same package, such as a universal Flash storage (UFS) package or an eMMC package. That is, memory system 502 can be implemented and packaged into different types of end electronic products. In one example as shown in FIG. 6A, memory controller 506 and a single memory device 504 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 602 can further include a memory card connector 604 coupling memory card 602 with a host (e.g., host 508 in FIG. 5). In another example as shown in FIG. 6B, memory controller 506 and multiple memory devices 504 may be integrated into an SSD 606. SSD 606 can further include an SSD connector 608 coupling SSD 606 with a host (e.g., host 508 in FIG. 5). In some implementations, the storage capacity and/or the operation speed of SSD 606 is greater than those of memory card 602.

According to one aspect of the present disclosure, a 3D memory device, includes a first semiconductor structure and a second semiconductor structure bonded with the first semiconductor structure. The first semiconductor structure includes an array of NAND memory strings, a semiconductor layer in contact with source ends of the array of NAND memory strings, a non-conductive layer aligned with the semiconductor layer, and a contact structure in the non-conductive layer. The non-conductive layer electrically insulates the contact structure from the semiconductor layer. The second semiconductor structure includes a transistor.

In some implementations, the non-conductive layer is a single layer in contact with the semiconductor layer.

In some implementations, the first semiconductor structure further includes a second contact structure through the non-conductive layer. The non-conductive layer insulates the contact structure and the second contact structure from each other. The non-conductive layer insulates the contact structure and the second contact structure from the semiconductor layer.

In some implementations, the semiconductor layer is located in a core region of the first semiconductor structure, and the non-conductive layer is located in a non-array region of the first semiconductor structure.

In some implementations, the non-conductive layer is located in the staircase region of the first semiconductor structure.

In some implementations, the non-conductive layer is located outside the staircase region of the first semiconductor structure.

In some implementations, the non-conductive layer includes a non-conductive material.

In some implementations, the non-conductive layer includes undoped amorphous silicon.

In some implementations, an area of the non-conductive layer is greater than an area in which a plurality of contact structures are formed and is less than or equal to a non-array region.

The 3D memory device of any one of claims 1-9, wherein In some implementations, the semiconductor layer and the non-conductive layer have a same thickness that is in a range of 100 nm to 600 nm.

In some implementations, the semiconductor layer includes doped polysilicon.

In some implementations, an area of the semiconductor layer is greater than or equal to an area in which all the NAND memory strings are formed.

In some implementations, the first semiconductor structure further includes a pad-out interconnect layer; and the second semiconductor structure further includes a substrate.

Another aspect of the present disclosure provides a 3D memory device that includes a first semiconductor structure having a core region and a non-array region. The first semiconductor structure includes an array of NAND memory strings in a sub-region of the core region, a semiconductor layer in contact with source ends of the array of NAND memory strings, a non-conductive layer in the non-array region, and a plurality of contact structures in the non-conductive layer and in another sub-region of the non-array region. The non-conductive layer electrically insulates the contact structures from the semiconductor layer. The 3D memory device includes a second semiconductor structure bonded with the first semiconductor structure. The second semiconductor structure includes a transistor.

In some implementations, the non-conductive layer is a single layer.

In some implementations, an area of the non-conductive layer is equal to or greater than an area of the other sub-region and is less than or equal to an area of the non-array region; and the non-conductive layer insulates the contact structures from one another.

In some implementations, an area of the semiconductor layer is equal to or greater than an area of the sub-region.

In some implementations, the non-conductive layer includes a non-conductive material.

In some implementations, the non-conductive layer includes undoped amorphous silicon.

In some implementations, the semiconductor layer and the non-conductive layer have a same thickness that is in a range of 100 nm to 600 nm.

In some implementations, the semiconductor layer includes doped polysilicon.

In some implementations, the first semiconductor structure further includes a pad-out interconnect layer; and the second semiconductor structure further includes a substrate.

Another aspect of the present disclosure provides a method for forming a 3D memory device. The method includes bonding a first semiconductor structure and a second semiconductor structure together, the first semiconductor structure having a core region and a non-array region. The method also includes depositing an undoped amorphous silicon layer over the core region and the non-array region of the first semiconductor structure, converting a first portion of the undoped amorphous silicon layer to a doped polysilicon layer, retaining a second portion of the undoped amorphous silicon layer in the non-array region, and forming a first contact portion in the second portion of the undoped amorphous silicon layer. The first contact portion is in contact with a second contact portion in the first semiconductor structure.

In some implementations, the method further includes converting the first portion of the undoped amorphous silicon layer into a doped amorphous silicon layer and converting the doped amorphous silicon layer to the doped polysilicon layer.

In some implementations, converting the first portion of the doped amorphous silicon layer includes performing a local thermal treatment on the first portion of the doped amorphous silicon layer.

In some implementations, the local thermal treatment includes a laser anneal process.

In some implementations, the laser anneal process has an anneal temperature in a range of 1300 degrees Celsius to 1700 degrees Celsius and includes a plurality of laser pulses each having a pulse time of 100 ns to 300 nm.

In some implementations, the undoped amorphous silicon layer is deposited using a low-temperature deposition process; and converting the undoped amorphous silicon layer to the doped amorphous silicon layer includes performing an ion implantation process.

In some implementations, the doped amorphous silicon layer is doped with N-type dopants that include at least one of phosphorous or arsenic.

In some implementations, forming the first semiconductor structure includes forming an array of NAND memory strings and the first contact portion above a substrate and thinning the substrate to expose source ends of the NAND memory strings.

In some implementations, the undoped amorphous silicon layer is deposited to be in contact with the source ends of the NAND memory strings.

In some implementations, the method further includes forming an insulating layer over the second portion of the undoped amorphous silicon layer and the doped polysilicon layer.

In some implementations, the method further includes forming a first opening in the non-array region. The first opening is through the insulating layer and the second portion of the undoped amorphous silicon layer and exposing the second contact portion. The method also includes forming a second opening in the core region. The second opening is through the insulating layer and exposing the doped polysilicon layer. The method further includes forming the first contact portion in the first opening and a third contact portion in the second opening. The third contact portion is in contact with the doped polysilicon layer.

In some implementations, the first opening and the second opening are formed in a same patterning process.

In some implementations, the method further includes forming, over the non-conductive layer, a first contact layer conductively connected to the first contact portion and a second contact layer conductively connected to the third contact portion. The first contact layer and the second contact layer are insulated from each other. The method further includes forming a pad-out interconnect layer over the first and second contact layers. The pad-out interconnect layer includes respective contact structures conductively connected to the first and second contact layers.

In some implementations, forming the second semiconductor structure includes forming a peripheral circuit over a respective substrate. The peripheral circuit includes a plurality of transistors.

Another aspect of the present disclosure provides a system that includes a memory device configured to store data. The memory device includes a first semiconductor structure having an array of NAND memory strings, a semiconductor layer in contact with source ends of the array of NAND memory strings, a non-conductive layer in contact with the semiconductor layer, and a contact structure in the non-conductive layer. The non-conductive layer electrically insulates the contact structure from the semiconductor layer. The memory device also includes a second semiconductor structure bonded with the first semiconductor structure and having a transistor. The system also includes a memory controller coupled to the memory device and configured to control the array of NAND memory strings through a peripheral circuit.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a first semiconductor structure comprising:
      an array of NAND memory strings,
      a first contact structure extending vertically at a lateral side of the array of NAND memory strings,
      a semiconductor layer having a lower surface in contact with source ends of the array of NAND memory strings,
      a non-conductive layer having an upper surface aligned with an upper surface of the semiconductor layer along a lateral plane,
      a first insulating layer in contact with the upper surface of the non-conductive layer and the upper surface of the semiconductor layer,
      a plurality of second contact structures in the non-conductive layer and the first insulating layer, one of the second contact structures being in contact with the first contact structure, wherein the non-conductive layer electrically insulates the second contact structures from each other and insulates the second contact structures from the semiconductor layer, and
      a third contact structure in the first insulating layer and in direct contact with the upper surface of the semiconductor layer; and
   a second semiconductor structure, bonded with the first semiconductor structure, comprising a transistor.

2. The 3D memory device of claim 1, wherein the non-conductive layer is a single layer in contact with the semiconductor layer.

3. The 3D memory device of claim 1, wherein:
   the semiconductor layer is located in a core region of the first semiconductor structure; and
   the non-conductive layer is located in a non-array region of the first semiconductor structure.

4. The 3D memory device of claim 3, wherein the non-conductive layer is located in a staircase region of the first semiconductor structure.

5. The 3D memory device of claim 3, wherein the non-conductive layer is located outside a staircase region of the first semiconductor structure.

6. The 3D memory device of claim 1, wherein the semiconductor layer and the non-conductive layer have a same thickness that is in a range of 100 nm to 600 nm.

7. The 3D memory device of claim 1, wherein the semiconductor layer comprises doped polysilicon, and the non-conductive layer comprises undoped amorphous silicon.

8. A system, comprising:
   a memory device configured to store data, comprising
      a first semiconductor structure comprising:
         an array of NAND memory strings,
         a first contact structure extending vertically at a lateral side of the array of NAND memory strings,
         a semiconductor layer having a lower surface in contact with source ends of the array of NAND memory strings,
         a non-conductive layer having an upper surface aligned with an upper surface of the semiconductor layer,
         a first insulating layer in contact with the upper surface of the non-conductive layer and the upper surface of the semiconductor layer,
         a plurality of second contact structures in the non-conductive layer and the first insulating layer, one of the second contact structures being in contact with the first contact structure, wherein the non-conductive layer electrically insulates the second contact structures from each other and insulates the second contact structures from the semiconductor layer, and
         a third contact structure in the first insulating layer and in direct contact with the upper surface of the semiconductor layer; and
      a second semiconductor structure, bonded with the first semiconductor structure, comprising a transistor, and a memory controller coupled to the memory device and configured to control the array of NAND memory strings through a peripheral circuit.

9. The 3D memory device of claim 1, wherein a lower surface of the non-conductive layer is aligned with the lower surface of the semiconductor layer.

10. The system of claim 8, wherein the non-conductive layer is a single layer in contact with the semiconductor layer.

11. The system of claim 8, wherein:
the semiconductor layer is located in a core region of the first semiconductor structure; and
the non-conductive layer is located in a non-array region of the first semiconductor structure.

12. The system of claim 8, wherein the semiconductor layer and the non-conductive layer have a same thickness that is in a range of 100 nm to 600 nm.

13. The system of claim 8, wherein the semiconductor layer comprises doped polysilicon, and the non-conductive layer comprises undoped amorphous silicon.

14. The system of claim 8, wherein a lower surface of the non-conductive layer is aligned with the lower surface of the semiconductor layer.

15. The 3D memory device of claim 1, wherein the first semiconductor structure further comprises:
a contact layer on the first insulating layer, comprising a first contact portion in contact with the plurality of second contact structures, and a second contact portion in contact with the third contact structure, wherein the first contact portion and the second contact portion are separated by an insulating portion;
a second insulating layer on the contact layer;
a first pad-out interconnect embedded in the second insulating layer and in contact with the first contact portion; and
a second pad-out interconnect embedded in the second insulating layer and in contact with the second contact portion.

16. The 3D memory device of claim 15, wherein:
a first lateral dimension of the one of the second contact structures in contact with the contact layer is greater than a second lateral dimension of the one of the second contact structures in contact with the first contact structure.

17. The system of claim 8, wherein the first semiconductor structure further comprises:
a contact layer on the first insulating layer, comprising a first contact portion in contact with the plurality of second contact structures, and a second contact portion in contact with the third contact structure, wherein the first contact portion and the second contact portion are separated by an insulating portion;
a second insulating layer on the contact layer;
a first pad-out interconnect embedded in the second insulating layer and in contact with the first contact portion; and
a second pad-out interconnect embedded in the second insulating layer and in contact with the second contact portion.

18. The system of claim 17, wherein:
a first lateral dimension of the one of the second contact structures in contact with the contact layer is greater than a second lateral dimension of the one of the second contact structures in contact with first contact structure.

19. The 3D memory device of claim 1, wherein:
a contact interface of the one of the second contact structures and the first contact structure is substantially coplanar with the lower surface of the semiconductor layer.

20. The system of claim 8, wherein:
a contact interface of the one of the second contact structures and the first contact structure is substantially coplanar with the lower surface of the semiconductor layer.

* * * * *